United States Patent
Yasunami et al.

(10) Patent No.: US 7,326,513 B2
(45) Date of Patent: Feb. 5, 2008

(54) POSITIVE WORKING RESIST COMPOSITION

(75) Inventors: Shoichiro Yasunami, Shizuoka (JP); Koji Shirakawa, Shizuoka (JP); Kazuyoshi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/791,559

(22) Filed: Mar. 3, 2004

(65) Prior Publication Data

US 2004/0175654 A1 Sep. 9, 2004

(30) Foreign Application Priority Data

Mar. 5, 2003 (JP) .......................... P.2003-058732

(51) Int. Cl.
G03F 7/004 (2006.01)
G03F 7/039 (2006.01)

(52) U.S. Cl. .............................. 430/270.1; 430/281.1; 430/286.1

(58) Field of Classification Search ............. 430/270.1, 430/281.1, 286.1
See application file for complete search history.

(56) References Cited

U.S. PATENT DOCUMENTS

| | | | | |
|---|---|---|---|---|
| 5,976,759 | A * | 11/1999 | Urano et al. | 430/270.1 |
| 5,981,140 | A * | 11/1999 | Sato et al. | 430/270.1 |
| 6,485,883 | B2 * | 11/2002 | Kodama et al. | 430/170 |
| 6,489,080 | B2 * | 12/2002 | Uenishi et al. | 430/281.1 |
| 6,656,660 | B1 * | 12/2003 | Urano et al. | 430/270.1 |
| 6,727,040 | B2 * | 4/2004 | Sasaki et al. | 430/270.1 |
| 6,733,951 | B2 | 5/2004 | Kodama | |
| 2001/0033993 | A1 * | 10/2001 | Kanna et al. | 430/285.1 |
| 2001/0041300 | A1 * | 11/2001 | Kodama et al. | 430/170 |
| 2001/0055726 | A1 * | 12/2001 | Kanna et al. | 430/270.1 |
| 2003/0075708 | A1 | 4/2003 | Kodama | |
| 2004/0033434 | A1 * | 2/2004 | Ishihara et al. | 430/270.1 |

FOREIGN PATENT DOCUMENTS

| | | | |
|---|---|---|---|
| JP | 09-304932 | A | 11/1997 |
| JP | 11-249292 | A | 9/1999 |
| JP | 11-295893 | A | 10/1999 |
| JP | 11-305443 | A | 11/1999 |
| JP | 2000-1469 | A | 1/2000 |
| JP | 2000-66382 | A | 3/2000 |
| JP | 2000-075487 | A | 3/2000 |
| JP | 2000-241980 | A | 9/2000 |
| JP | 2000-267282 | A | 9/2000 |
| JP | 2000-284482 | A | 10/2000 |
| JP | 2001-33970 | A | 2/2001 |
| JP | 2002-049156 | A | 2/2002 |
| JP | 2002-55457 | A | 2/2002 |
| JP | 2002131898 | * | 5/2002 |
| JP | 2002-278054 | A | 9/2002 |
| JP | 2002341538 | * | 11/2002 |
| JP | 2003-035948 | A | 2/2003 |
| JP | 2003-057827 | A | 2/2003 |
| JP | 2002-323768 | A | 8/2007 |

OTHER PUBLICATIONS

English language machine translation of JP 2002-131898.*
English language machine translation of JP 2002-341538.*

* cited by examiner

*Primary Examiner*—Hoa Van Le
(74) *Attorney, Agent, or Firm*—Sughrue Mion, Pllc.

(57) ABSTRACT

A positive working resist composition comprising (A1) a resin containing a repeating unit represented by formula (1) defined in the specification and a repeating unit represented by formula (2) defined in the specification and having a property of being insoluble or sparingly soluble in an alkali developing solution and becoming soluble in an alkali developing solution by the action of an acid, and (B) a compound capable of generating sulfonic acid upon irradiation with active rays or radiations in an amount of from 5 to 20% by weight based on the total solid content of the positive working resist composition.

10 Claims, No Drawings

POSITIVE WORKING RESIST COMPOSITION

FIELD OF THE INVENTION

The present invention relates to a positive working resist composition that is suitably used in an, ultramicro lithography process such as fabrication of VLSI and high-capacity microchip and other photo-fabrication processes. More specifically, the invention relates to a positive working photoresist capable of forming a pattern with high definition using electron beams, X rays, EUV rays, etc. and to a positive resist composition that can be suitably used for microprocessing of semiconductor devices using electron beams, X rays or EUV rays.

BACKGROUND OF THE INVENTION

In a fabrication process of semiconductor devices such as IC and LSI, microprocessing by lithography using a photoresist composition is carried out. In recent years, with the progress of integration of an integrated circuit, ultrafine pattern formation of sub-micron regions or quarter-micron regions is being required. Following this, there is seen a tendency that the exposure wavelength is shifted to a shorter wavelength side from the g-line to the i-line and further to the KrF excimer laser beams. Further, besides the excimer laser beams, development of lithography using electron beams, X rays or EUV rays is currently advancing.

In particular, the electron beam lithography is positioned as the next-generation or after the next-generation pattern formation technology, and a positive working resist with high sensitivity and high resolution is demanded. Especially, for the sake of shortening the wafer processing time, realization of high sensitivity is a very important problem. However, in positive working resists for electron beams, when realization of high sensitivity is pursued, not only a resolving power lowers, but also deterioration of line edge roughness occurs. Thus, development of resists that can be satisfied with these characteristics at the same time is eagerly demanded. The "line edge roughness" as referred to herein means a phenomenon wherein since an edge of an interface between a pattern of a resist and a substrate irregularly fluctuates in a vertical direction to the line direction due to characteristics of the resist, the edge is seen unevenly when the pattern is seen downward from the upper side. The unevenness is transferred in an etching step using the resist as a mask to deteriorate electrical characteristics, resulting in a lowering in the yield. In particular, in ultrafine regions of not larger than 0.25 μm, the line edge roughness is an extremely important problem to be improved. High sensitivity is in the trade-off relation with high resolution, good pattern shape and good line edge, roughness, and it is very important to satisfy these requirements at the same time.

In addition, in lithography using X rays or EUV rays, it is an important problem to satisfy high sensitivity and high resolution at the same time, and dissolution of this problem is necessary.

As resists that are suited for the lithography process using such electron beams, X rays or EUV rays, chemically amplified resists utilizing acid catalyst reaction are mainly used from the standpoint of high sensitivity. In positive working resists, chemically amplified resist compositions containing a phenolic polymer having such natures that it is insoluble or sparingly soluble in an alkaline aqueous solution and that it becomes soluble in an alkaline aqueous solution by the action of an acid (the phenolic polymer will be abbreviated as "phenolic acid-decomposable resin", hereinafter) and an acid generator as the major components are effectively used.

With respect to these positive working resists for electron beams, X rays or EUV rays, some resist compositions using a phenolic acid-decomposable resin and a relatively large amount of a compound capable of generating sulfonic acid upon irradiation with active rays or radiations (hereinafter abbreviated as "sulfonic acid generator") have hitherto been known (for example, see Patent Documents 1 to 5).

However, even in any combination of these materials, it is the present state that high sensitivity, high resolution, good pattern shape, and good line edge roughness cannot be satisfied at the same time in ultrafine regions.

Patent Document 1: JP-A-2002-55457 (the term "JP-A" as used herein means an "unexamined published Japanese patent application")
Patent Document 2: JP-A-2000-66382
Patent Document 3: JP-A-2000-1469
Patent Document 4: JP-A-2001-33970
Patent Document 5: JP-A-11-249292

SUMMARY OF THE INVENTION

An object of the invention is to solve the problems in technologies for enhancing the performance in microprocessing of semiconductor devices using high energy rays, for example, X rays, electron beams or EUV rays and specifically to provide a positive working resist composition capable of satisfying high sensitivity, high resolution, good pattern shape and good line edge roughness at the same time.

Other object of the invention will become apparent from the following description.

The present inventors made extensive and intensive investigations. As a result, it has been surprisingly found that the objects of the invention can be achieved by a positive working resist composition containing a specific phenolic acid-decomposable resin.

Specifically, the invention can be achieved by the following constitutions.

(1) A positive working resist composition comprising (A1) a resin containing a repeating unit represented by the following formula (1) and a repeating unit represented by the following formula (2) and having a property of being insoluble or sparingly soluble in an alkali developing solution and becoming soluble in an alkali developing solution by the action of an acid, and (B) a compound capable of generating sulfonic acid upon irradiation with active rays or radiations in an amount of from 5 to 20% by weight based on the total solid content of the positive working resist composition.

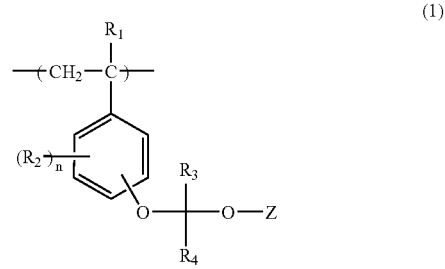

-continued

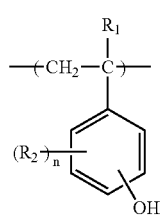

(2)

In formulae (1) and (2), $R_1$ represents a hydrogen atom, a methyl group, a cyano group, a halogen atom or a perfluoroalkyl group having from 1 to 4 carbon atoms;

$R_2$ represents a hydrogen atom, an alkyl group, a halogen atom, an aryl group, an alkoxy group or an acyl group;

$R_3$ and $R_4$ each independently represent a hydrogen atom or an alkyl group having from 1 to 4 carbon atoms;

Z represents a hydrocarbon group having from 6 to 30 carbon atoms and containing at least one cyclic structural unit selected from an alicyclic structure, an aromatic cyclic structure and a bridged alicyclic structure; and n represents an integer of from 1 to 4.

(2) The positive working resist composition as set forth above in (1), which further comprises (C) a nitrogen-containing basic compound.

(3) The positive working resist composition as set forth above in (1) or (2), which further comprises (A2) a resin containing a repeating unit represented by the following formula (2) and a repeating unit represented by the following formula (3) and having a property of being insoluble or sparingly soluble in an alkaline developing solution and becoming soluble in an alkaline developing solution by the action of an acid.

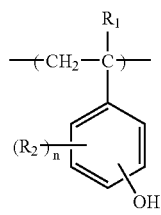

(2)

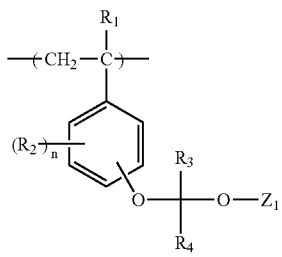

(3)

In the formulae (2) and (3), $R_1$ represents a hydrogen atom, a methyl group, a cyano group, a halogen atom or a perfluoroalkyl group having from 1 to 4 carbon atoms;

$R_2$ represents a hydrogen atom, an alkyl group, a halogen atom, an aryl group, an alkoxy group or an acyl group;

$R_3$ and $R_4$ each independently represent a hydrogen atom or an alkyl group having from 1 to 4 carbon atoms;

$Z_1$ represents a hydrocarbon group having from 1 to 5 carbon atoms; and n represents an integer of from 0 to 4.

(4) The positive working resist composition as set forth in any one of (1) to (3) above, wherein an amount of the compound (B) capable of generating sulfonic acid upon irradiation with active rays or radiations is from 7 to 16% by weight based on the total solid content of the positive working resist composition.

Preferred embodiments of the invention include the followings.

(5) The positive working resist composition as set forth in any one of (1) to (4) above, which further comprises (D) a compound capable of generating a carboxylic acid upon irradiation with active rays or radiations.

(6) The positive working resist composition as set forth in any one of (1) to (5) above, wherein the resin (A1) contains the repeating unit represented by formula (1), the repeating unit represented by formula (2) and a repeating unit represented by the following formula (4).

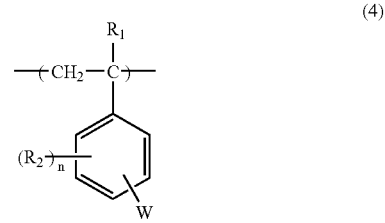

(4)

In the formula, $R_1$, $R_2$, and n have the same meanings as $R_1$, $R_2$, and n in formula (1), respectively; and W represents a group that is not decomposed by the action of an acid.

(7) The positive working resist composition as set forth in any one of (3) to (6) above, wherein the resin (A2) contains the repeating unit represented by formula (2), the repeating unit represented by formula (3) and a repeating unit represented by the formula (4) described above.

(8) The positive working resist composition as set forth in any one of (1) to (7) above, which further comprises a fluorine based and/or silicon based surfactant.

DETAILD DESCRIPTION OF THE INVENTION

The compounds that are used in the invention will be described below in detail.

[1] (A1) Resin containing a repeating unit represented by formula (1) and a repeating unit represented by formula (2) and having a property of being insoluble or sparingly soluble in an alkaline developing solution and becoming soluble in an alkaline developing solution by the action of an acid:

In formula (1), $R_1$ represents a hydrogen atom, a methyl group, a cyano group, a halogen atom or a perfluoroalkyl group (represented by a $C_mF_{2m+1}$ group, wherein m represents an integer of from 1 to 4). $R_1$ preferably represents a hydrogen atom, a methyl group or a $C_mF_{2m+1}$ group (m is preferably 1), and especially preferably a hydrogen atom or a methyl group.

The alkyl group represented by $R_2$ may have a substituent, and examples thereof include an alkyl group having from 1 to 8 carbon atoms. Specifically, a methyl group, an ethyl group, a propyl group, an n-butyl group, a sec-butyl group, a hexyl group and an octyl group can be preferably enumerated.

The alkoxy group represented by $R_2$ may have a substituent, and examples thereof include an alkoxy group having from 1 to 8 carbon atoms. Specifically, a methoxy group, an ethoxy group, a propoxy group, a butoxy group, a pentyloxy group, a hexyloxy group and a cyclohexyloxy group can be preferably enumerated.

The aryl group represented by $R_2$ may have a substituent, and examples thereof include an aryl group having from 6 to 15 carbon atoms. Specifically, a phenyl group, a tolyl group, a naphthyl group, and an anthryl group can be preferably enumerated.

The acyl group represented by $R_2$ may have a substituent, and examples thereof include an acyl group having from 2 to 8 carbon atoms. Specifically, a formyl group, an acetyl group, a propanoyl group, a butanoyl group, a pivaloyl group and a benzoyl group can be preferably enumerated.

The alkyl group having from 1 to 4 carbon atoms represented by $R_3$ and $R_4$ may have a substituent, and examples thereof include a methyl group, an ethyl group and a propyl group.

As substituents that the foregoing groups may have, a hydroxyl group, a carboxyl group, a halogen atom (for example, a fluorine atom, a chlorine atom, a bromine atom or an iodine atom) and an alkoxy group (for example, a methoxy group, an ethoxy group, a propoxy group or a butoxy group) can be enumerated.

Z represents an acid-decomposable group containing at least one cyclic structure selected from an alicyclic structure, an aromatic cyclic structure and a bridged alicyclic structure. Of these, structures containing an aromatic group (especially a phenyl group), or structures containing an alicyclic structure or a bridged alicyclic structure represented by any one of the following formulae (pI) to (pVI) are preferable.

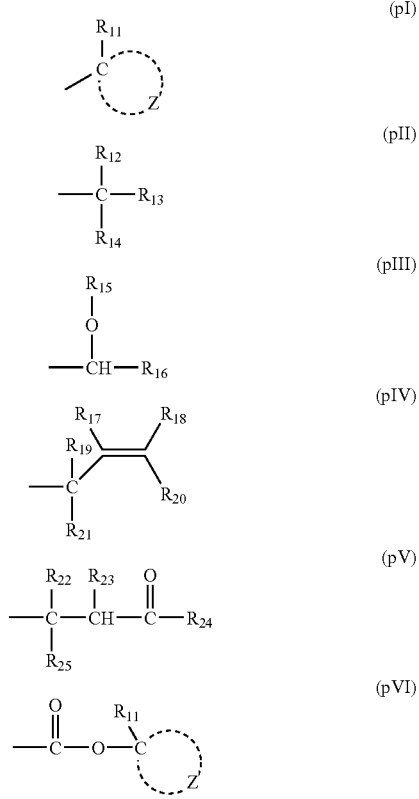

In the formulae, $R_{11}$ represents a methyl group, an ethyl group, an n-propyl group, an isopropyl group, an n-butyl group, an isobutyl group or a sec-butyl group; and Z represents an atomic group necessary for forming an alicyclic hydrocarbon group together with the carbon atom.

$R_{12}$ to $R_{16}$ each independently represent a linear or branched alkyl group having from 1 to 4 carbon atoms or an alicyclic hydrocarbon group, provided that at least one of $R_{12}$ to $R_{14}$, or either one of $R_{15}$ or $R_{16}$ represents an alicyclic hydrocarbon group.

$R_{17}$ to $R_{21}$ each independently represent a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ or $R_{21}$ represents a linear or branched alkyl group having from 1 to 4 carbon atoms or an alicyclic hydrocarbon group.

$R_{22}$ to $R_{25}$ each independently represent a hydrogen atom, a linear or branched alkyl group having from 1 to 4 carbon atoms or an alicyclic hydrocarbon group, provided that at least one of $R_{22}$ to $R_{25}$ represents an alicyclic hydrocarbon group. Also, $R_{23}$ and $R_{24}$ may be taken together to form a ring.

In formulae (pI) to (pVI), the alkyl group for each of $R_{12}$ to $R_{25}$ represents a linear or branched alkyl group having from 1 to 4 carbon atoms, which may be substituted or unsubstituted, Examples of the alkyl group include a methyl group, an ethyl group, an n-propyl group, an isopropyl group, an n-butyl group, an isobutyl group, a sec-butyl group and a tert-butyl group.

Also, examples of substituents that the alkyl group may have include an alkoxy group having from 1 to 4 carbon atoms, a halogen atom (for example, a fluorine atom, a chlorine atom, a bromine atom or an iodine atom), an acyl group, an acyloxy group, a cyano group, a hydroxyl group, a carboxy group, an alkoxycarbonyl group and a nitro group.

The alicyclic hydrocarbon group in $R_{12}$ to $R_{25}$ or the alicyclic hydrocarbon group formed by Z and the carbon atom may be monocyclic or polycyclic. Specifically, groups having a monocyclic, bicyclic, tricyclic or tetracyclic structure having 5 or more carbon atoms can be enumerated. The number of carbon atoms included therein is preferably from 6 to 30, and especially preferably from 7 to 25. The alicyclic hydrocarbon groups may have a substituent.

Structural examples of the alicyclic moiety in the alicyclic hydrocarbon group are described below.

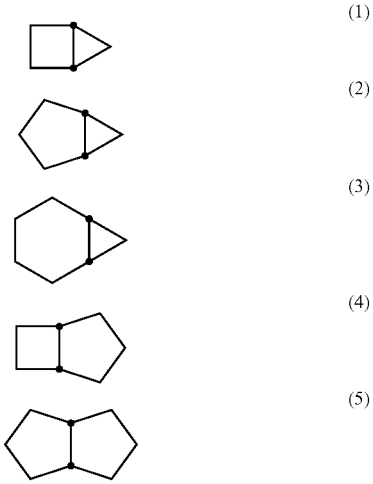

-continued

(30) 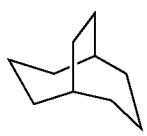

(31) 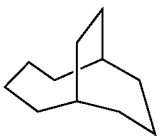

(32) 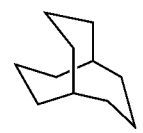

(33) 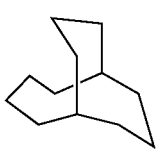

(34) 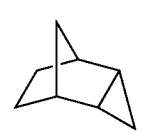

(35) 

(36) 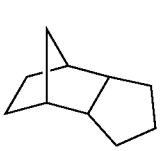

(37) 

(38) 

(39) 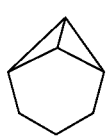

(40) 

(41) 

(42) 

(43) 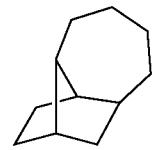

(44) 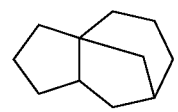

(45) 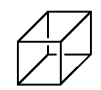

(46) 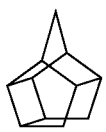

(47) 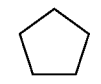

(48) 

(49) 

(50) 

In the invention, preferred examples of the foregoing alicyclic moiety include an adamantyl group, a noradamantyl group, a decalin residue, a tricyclodecanyl group, a tetracyclododecanyl group, a norbonyl group, a cedrol group, a cyclohexyl group, a cycloheptyl group, a cyclooctyl group, a cyclodecanyl group and a cyclododecanyl group. Of these, an adamantyl group, a decalin residue, a norbonyl group, a cedrol group, a cyclohexyl group, a cycloheptyl group, a cyclooctyl group, a cyclodecanyl group and a cyclododecanyl group are more preferable.

Examples of the substituent of the alicyclic hydrocarbon group include an alkyl group, a substituted alkyl group, a halogen atom, a hydroxyl group, an alkoxy group, a carboxyl group and an alkoxycarbonyl group. As the alkyl group, a lower alkyl group, for example, a methyl group, an ethyl group, a propyl group, an isopropyl group or a butyl group is preferable; and a methyl group, an ethyl group, a propyl group and an isopropyl group are more preferable. As the substituent of the substituted alkyl group, a hydroxyl group, a halogen atom and an alkoxy group can be enumerated. As the alkoxy group, those having from 1 to 4 carbon atoms, for example, a methoxy group, an ethoxy group, a propoxy group or a butoxy group can be enumerated.

Specific examples of monomers containing a group represented by any one of formulae (pI) to (pVI) are described below, but it should not be construed that the invention is limited thereto.

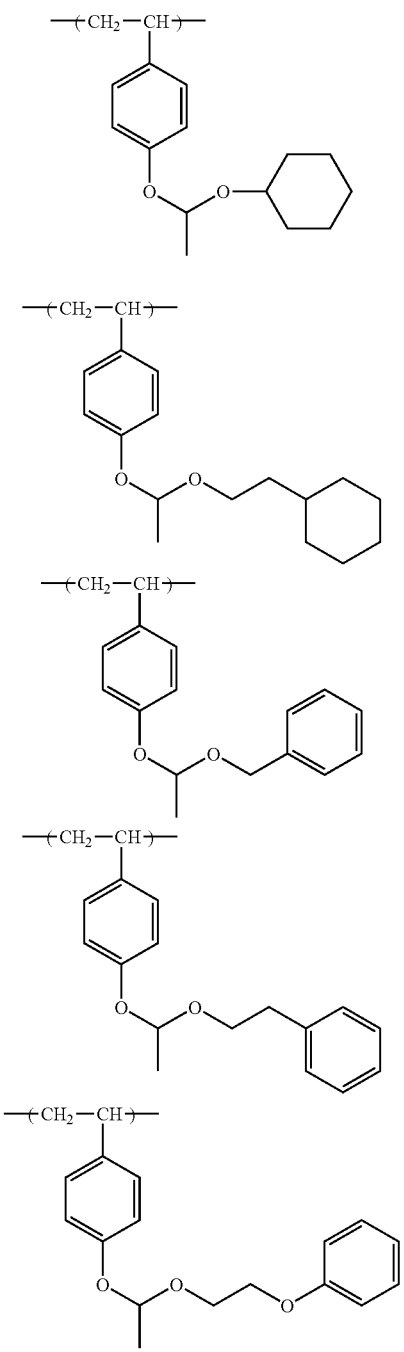

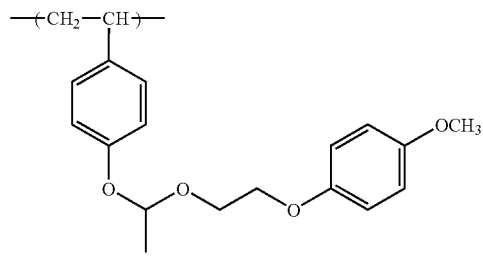

-continued

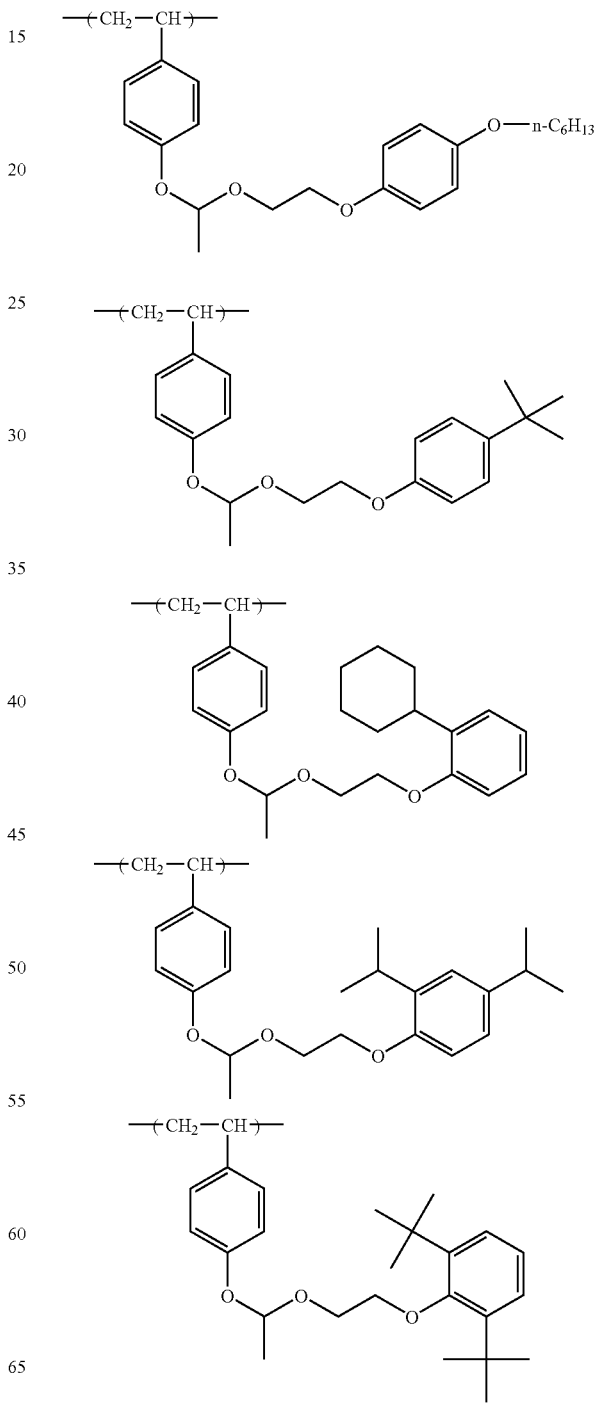

-continued
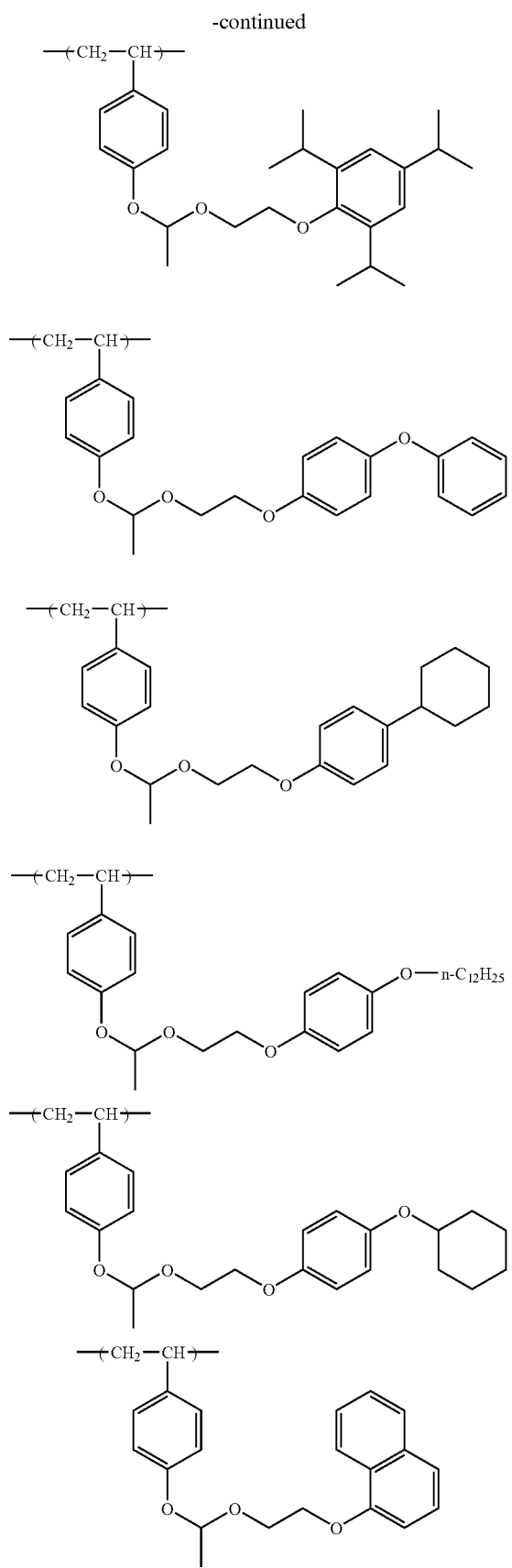
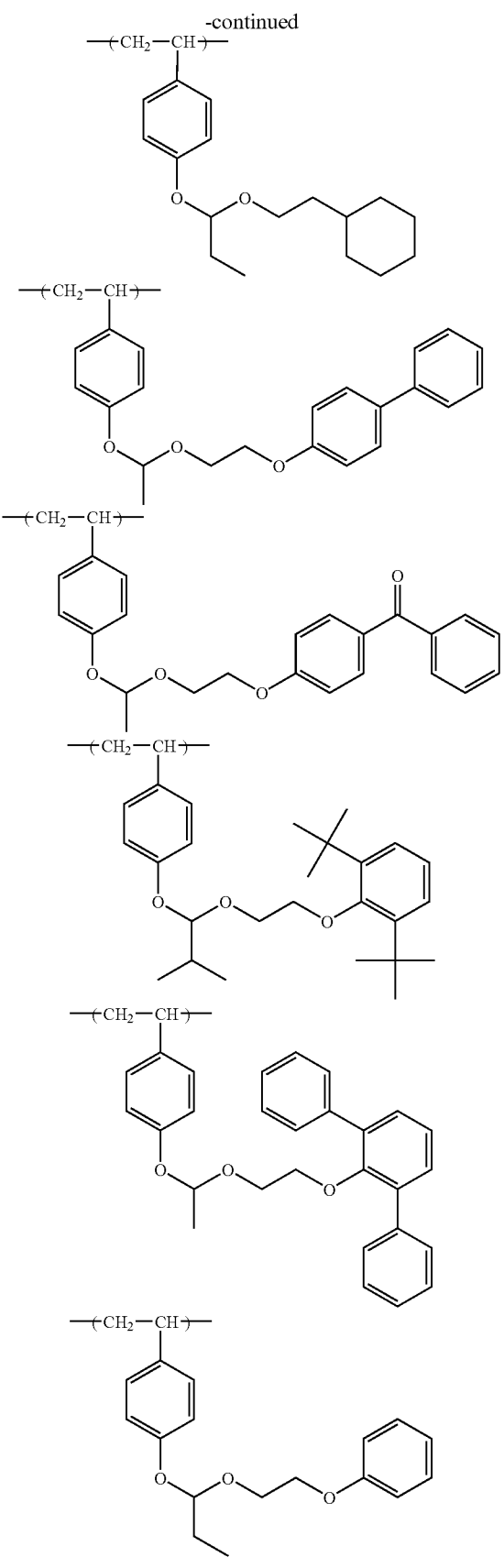

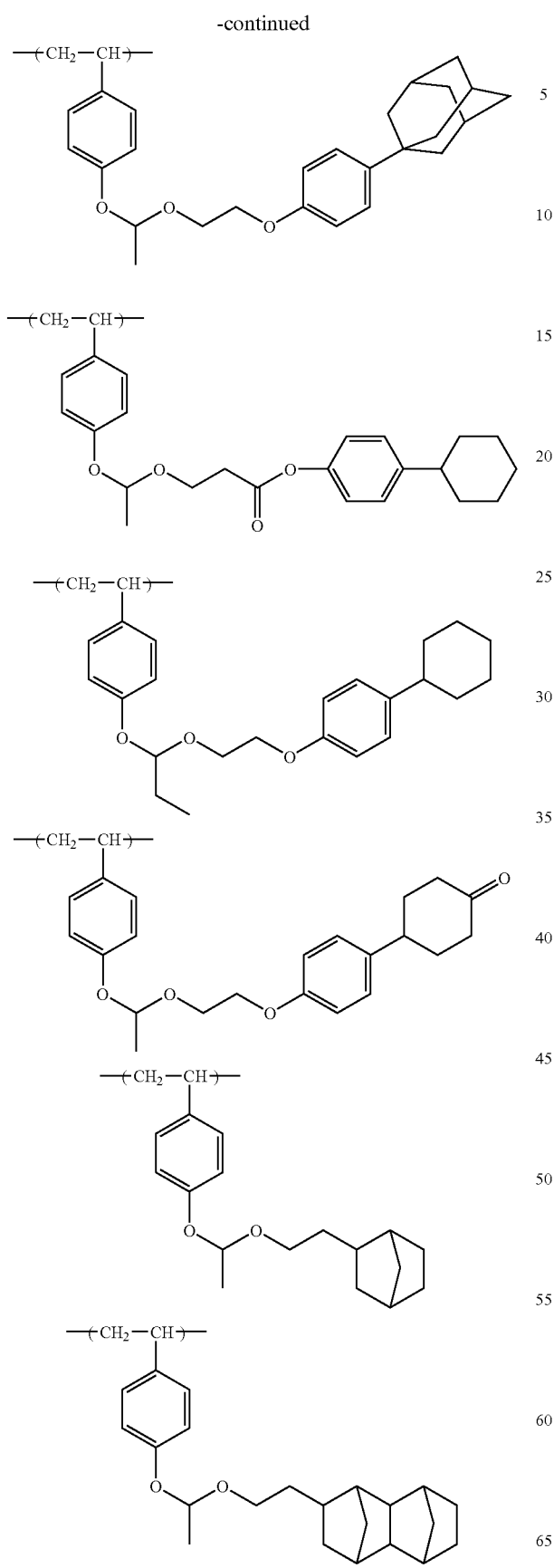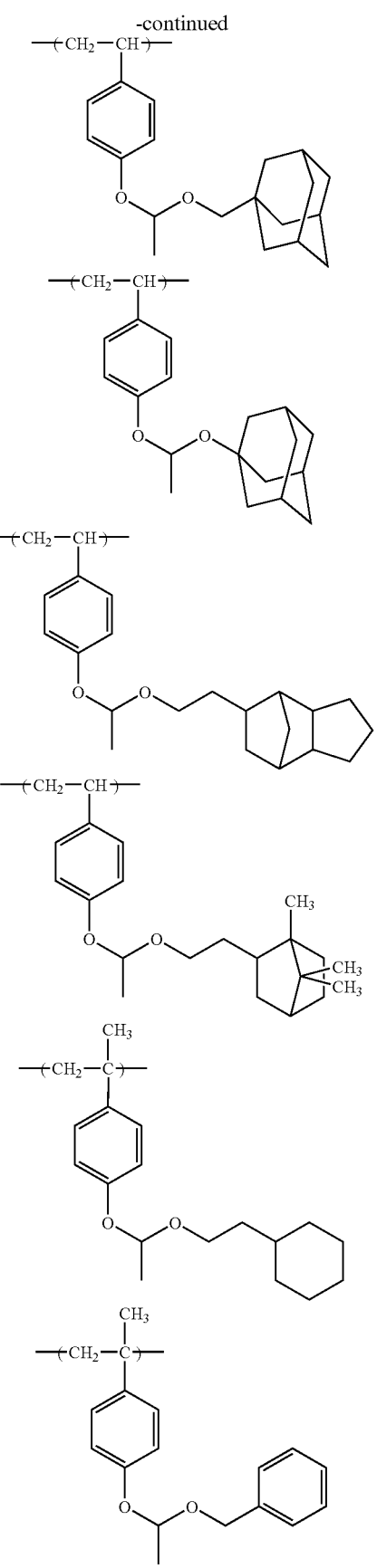

-continued

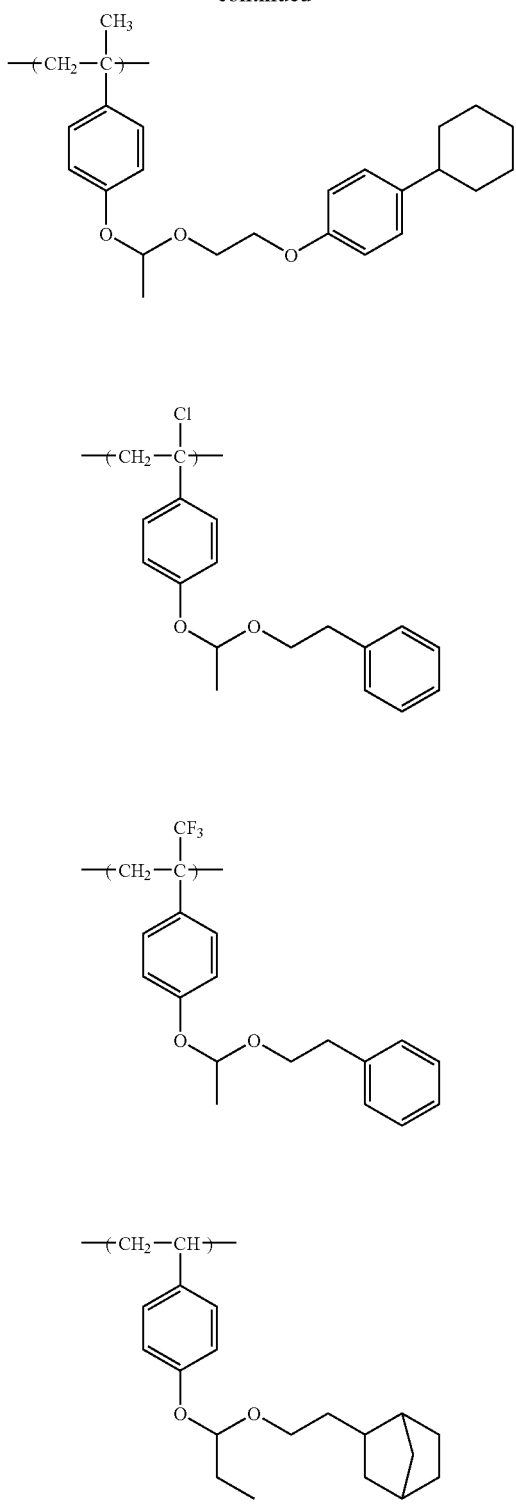

In formula (2), $R_1$, $R_2$ and n has the same meaning as $R_1$, $R_2$ and n in formula (1), respectively.

$R_1$, $R_2$ and n in formula (2) may be the same as or different from $R_1$, $R_2$ and n in formula (1), respectively.

In formula (2), the OH group may be present at any position on the benzene ring, but it is preferably present at the meta-position or para-position, and especially preferably at the para-position of the styrene skeleton.

Specific examples of the repeating unit represented by formula (2) are described below, but it should not be construed that the invention is limited thereto.

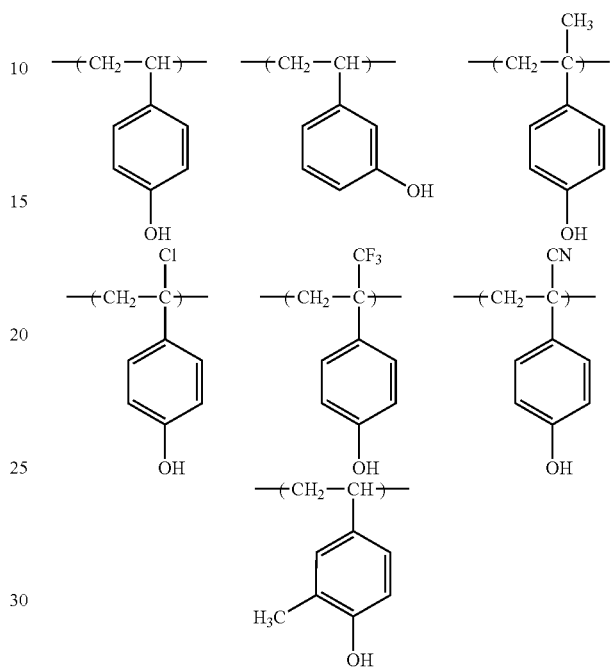

[2] (A2) Resin containing a repeating unit represented by formula (2) and a repeating unit represented by formula (3) and having a property of being insoluble or sparingly soluble in an alkaline developing solution and becoming soluble in an alkaline developing solution by the action of an acid:

The repeating unit represented by formula (2), which the resin (A2) contains, is the same as the repeating unit represented by formula (2), which the resin (A1) contains.

In formula (3), $R_1$, $R_2$, $R_3$, $R_4$ and n have the same meanings as $R_1$, $R_2$, $R_3$, $R_4$ and n in formula (1), respectively.

In formula (3), $Z_1$ represents a hydrocarbon group having from 1 to 5 carbon atoms, which may have a substituent. $Z_1$ is preferably an alkyl group having from 1 to 5 carbon atoms, and especially preferably an alkyl group having from 1 to 4 carbon atoms.

As substituents that the alkyl group may have, an alkoxy group having from 1 to 4 carbon atoms (for example, a methoxy group, an ethoxy group or a butoxy group), a hydroxyl group, an oxo group, an alkylcarbonyl group (preferably having from 2 to 5 carbon atoms), an alkylcarbonyloxy group (preferably having from 2 to 5 carbon atoms), an alkyloxycarbonyl group (preferably having from 2 to 5 carbon atoms) and a halogen atom (for example, a chlorine atom, a bromine atom or a fluorine atom) can be enumerated.

Also, $Z_1$ may form a ring together with $R_3$ or $R_4$. In such a case, the ring is preferably a 5- or 6-membered ring.

Specific examples of the repeating unit represented by formula (3) are described below, but it should not be construed that the invention is limited thereto.

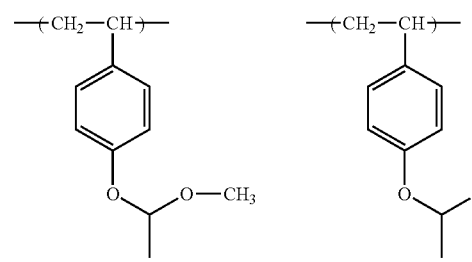

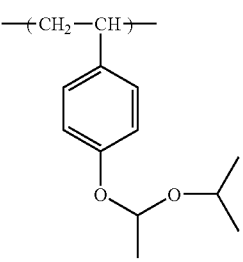

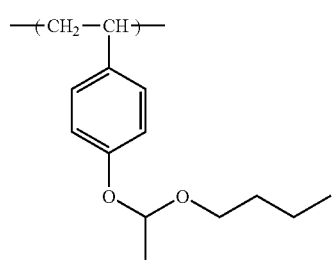

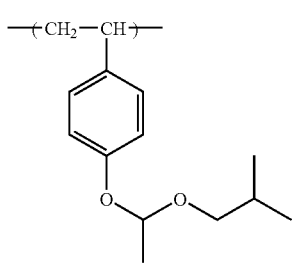

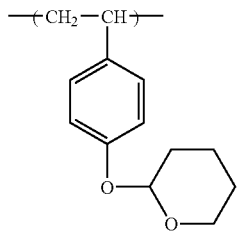 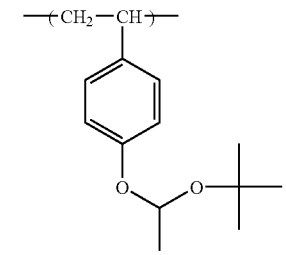

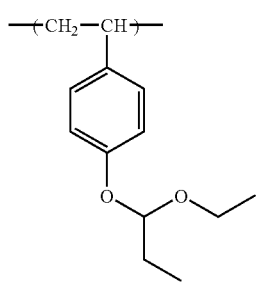 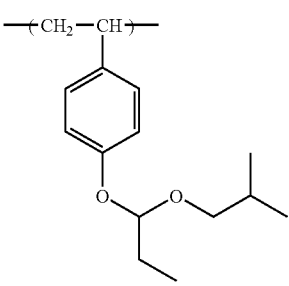

-continued

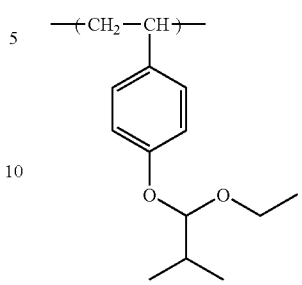

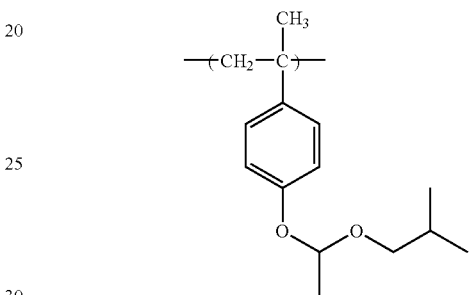

It is also preferable that the resin (A1) and resin (A2) each contains a repeating unit represented by formula (4).

In formula (4), $R_1$, $R_2$ and n have the same meaning as $R_1$, $R_2$ and n in (1), respectively.

In formula (4), $R_1$, $R_2$ and n may be the same as or different from $R_1$, $R_2$ and n in formula (1) or (2), respectively.

W represents a group that is not decomposed by the action of an acid (hereinafter also referred to as an acid-stable group). Specifically, a hydrogen atom, a halogen atom, an alkyl group, a cycloalkyl group, an alkenyl group, an aryl group, an alkyloxy group (provided that an —O— tertiary alkyl is excluded), an acyl group, a cycloalkyloxy group, an alkenyloxy group, an aryloxy group, an alkylcarbonyloxy group, an alkylamidomethyloxy group, an alkylamido group, an arylamidomethyl group and an arylamido group are enumerated. As the acid-stable group, an acyl group, an alkylcarbonyloxy group, an alkyloxy group, a cycloalkyloxy group, an aryloxy group, an alkylamidomethyloxy group and alkylamido group are preferable; and an acyl group, an alkylcarbonyloxy group, an alkyloxy group, a cycloalkyloxy group and an aryloxy group are more preferable.

In the acid-stable group represented by W, the alkyl group is preferably that having from 1 to 4 carbon atoms, for example, a methyl group, an ethyl group, a propyl group, an n-butyl group, a sec-butyl group or a tert-butyl group; the cycloalkyl group is preferably that having from 3 to 10 carbon atoms, for example, a cyclopropyl group, a cyclobutyl group, a cyclohexyl group or an adamantyl group; the alkenyl group is preferably that having from 2 to 4 carbon atoms, for example, a vinyl group, a propenyl group, an allyl group or a butenyl group; and the aryl group is preferably that having from 6 to 14 carbon atoms, for example, a phenyl group, a xylyl group, a tolyl group, a cumenyl group, a naphthyl group or an anthranyl group. As the alkoxy group, an alkoxy group having from 1 to 4 carbon atoms, for example, a methoxy group, an ethoxy group, a hydroxyethoxy group, a propoxy group, a hydroxypropoxy group, an n-butoxy group, an isobutoxy group or a sec-butoxy group is preferable.

W may be present at any position on the benzene ring, but it is preferably present at the meta-position or para-position, and especially preferably at the para-position of the styrene skeleton.

Specific examples of the repeating unit represented by the formula (4) are described below, but it should not be construed that the invention is limited thereto.

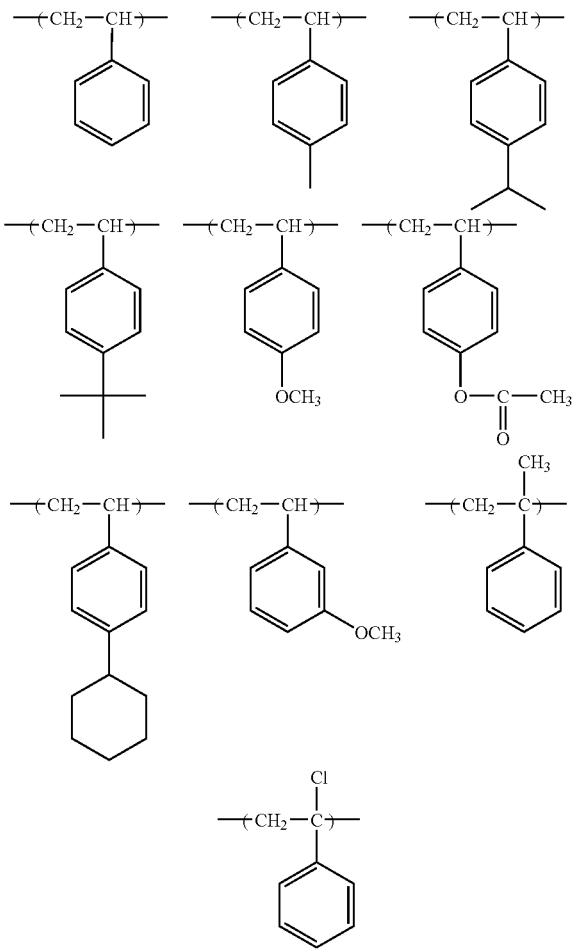

The content of the repeating unit represented by formula (1) in the resin (A1) and the content of the repeating unit represented by formula (3) in the resin (A2) are each preferably from 3 to 80% by mole, more preferably from 5 to 70% by mole, and especially preferably from 5 to 50% by mole based on the total repeating units in the respective resins. When the content of the repeating unit is less than 3% by mole, reduction in film thickness in unexposed areas tends to increases, or resolution tends to lower. On the other hand, when it exceeds 80% by mole, adhesion failure to a substrate or scum tends to occur.

The content of the repeating unit represented by formula (2) in each of the resins (A1) and (A2) is preferably from 20 to 97% by mole, more preferably from 30 to 95% by mole, and especially preferably from 50 to 95% by mole based on the total repeating units in the respective resins. When the content of the repeating unit is less than 20% by weight, adhesion failure to a substrate or scum is liable to occur. On the other hand, when it exceeds 97% by mole, reduction in film thickness in unexposed areas tends to increases, or resolution tends to lower.

Each of the resins (A1) and (A2) may contain a repeating unit represented by formula (4) in addition to the foregoing essential repeating units, and such is preferable from the viewpoints of enhancing the film quality, restraining the reduction of film thickness in unexposed areas, etc. The content of the repeating unit represented by formula (4) is preferably from 0 to 50% by mole, more preferably from 0 to 40% by mole, and especially preferably from 0 to 30% by mole based on the total repeating units in the respective resins.

Also, for the sake of keeping good developability with an alkali developing solution, each of the resins (A1) and (A2) may be copolymerized with other adequate polymerizable monomer capable of introducing an alkali-soluble group, for example, a phenolic hydroxyl group and a carboxyl group. For the sake of enhancing the film quality, each of the resins (A1) and (A2) may be copolymerized with other hydrophobic polymerizable monomer, for example, an alkyl acrylate or an alkyl methacrylate.

Further, the resins (A1) and (A2) may each contain other monomer containing an acid-decomposable group other than the acid-decomposable group contained in the repeating unit represented by formula (1) or (3), and examples thereof include a group represented by —C(=O)—$X_1$—$R_0$.

In the above formula, as $R_0$, a tertiary alkyl group (for example, a tert-butyl group or a tert-amyl group), an isobornyl group, a 1-alkoxyethyl group (for example, a 1-ethoxyethyl group, a 1-butoxyethyl group, a 1-isobutoxyethyl group or a 1-cycloxyethyl group), an alkoxymethyl group (for example, a 1-methoxymethyl group or a 1-ethoxymethyl group), a 3-oxoalkyl group, a tetrahydropyranyl group, a tetrahydrofuranyl group, a trialkylsilyl ester group, a 3-oxocyclohexyl ester group, a 2-methyl-2-adamantyl group and a mevalonic lactone residue are enumerated. $X_1$ represents an oxygen atom, a sulfur atom, —NH—, —$NHSO_2$— or —$NHSO_2NH$—.

The resins (A1) and (A2) can be synthesized by known synthesis methods, for example, a method of reacting an alkali-soluble resin with a precursor of an acid-decomposable group and a method of copolymerizing an acid-decomposable group-containing monomer with a variety of monomers, as described in European Patent 254,853, JP-A-2-258500, JP-A-3-223860 and JP-A-4-251259.

Each of the resins (A1) and (A2) preferably has a weight average molecular weight (Mw) in the range of from 1,000 to 200,000, more preferably from 1,500 to 100,000, and especially preferably from 2,000 to 50,000. When the weight average molecular weight is less than 1,000, reduction of film thickness in the unexposed area increases. On the other hand, when it exceeds 200,000, the dissolution rate of the resin itself in an alkali becomes slow so that the sensitivity tends to decrease. Also, the molecular weight distribution (Mw/Mn) is preferably from 1.0 to 4.0, more preferably from 1.0 to 3.0, and especially preferably from 1.0 to 2.5.

The weight average molecular weight is defined as a value measured by gel permeation chromatography and calculated in terms of polystyrene.

Also, each of the resins (A1) and (A2) may be used in admixture of two or more thereof.

The addition amount of the resin (A1) is suitably from 10 to 96% by weight, preferably from 15 to 96% by weight, and especially preferably from 20 to 95% by weight in total based on the solid content of the positive working resist.

In the invention, the resins (A1) and (A2) may be used jointly, and such is preferable in view of controlling the pattern shape or sensitivity. In such a case, the weight ratio of the resin (A1) to the resin (A2) used is preferably in the range of from 100/0 to 20/80, more preferably from 100/0 to 30/70, and especially preferably from 100/0 to 40/60.

Specific examples of the resin (A1) are described below, but it should not be construed that the invention is limited thereto.

A1-1

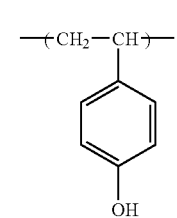 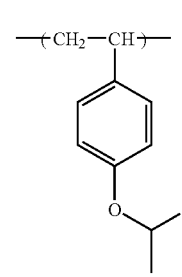

A1-2

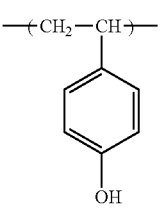 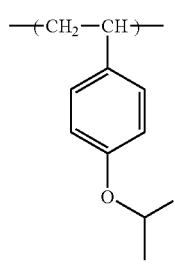

A1-3

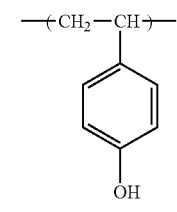 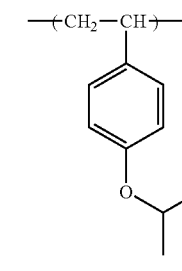

A1-4

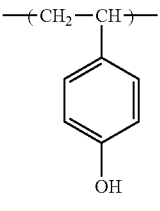 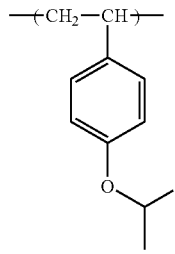

A1-5

 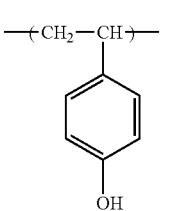

-continued

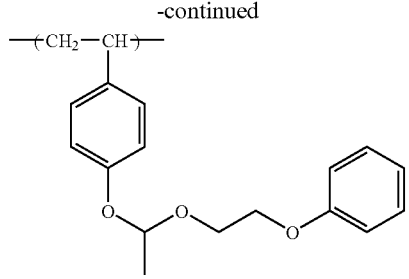

A1-6

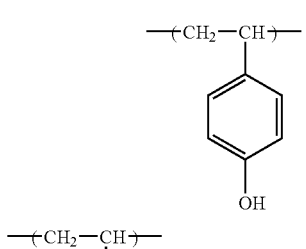

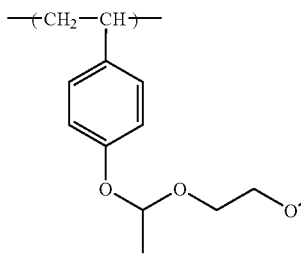

A1-7

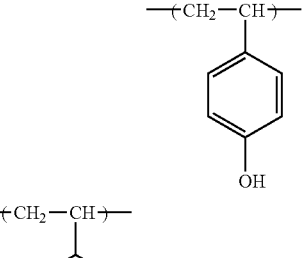

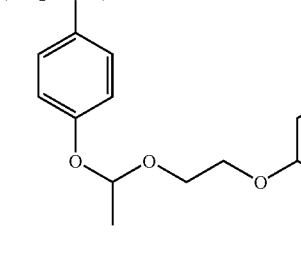

A1-8

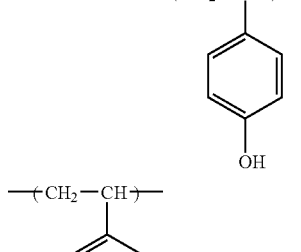

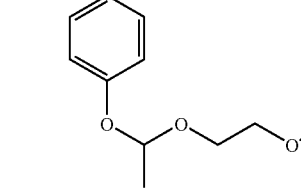

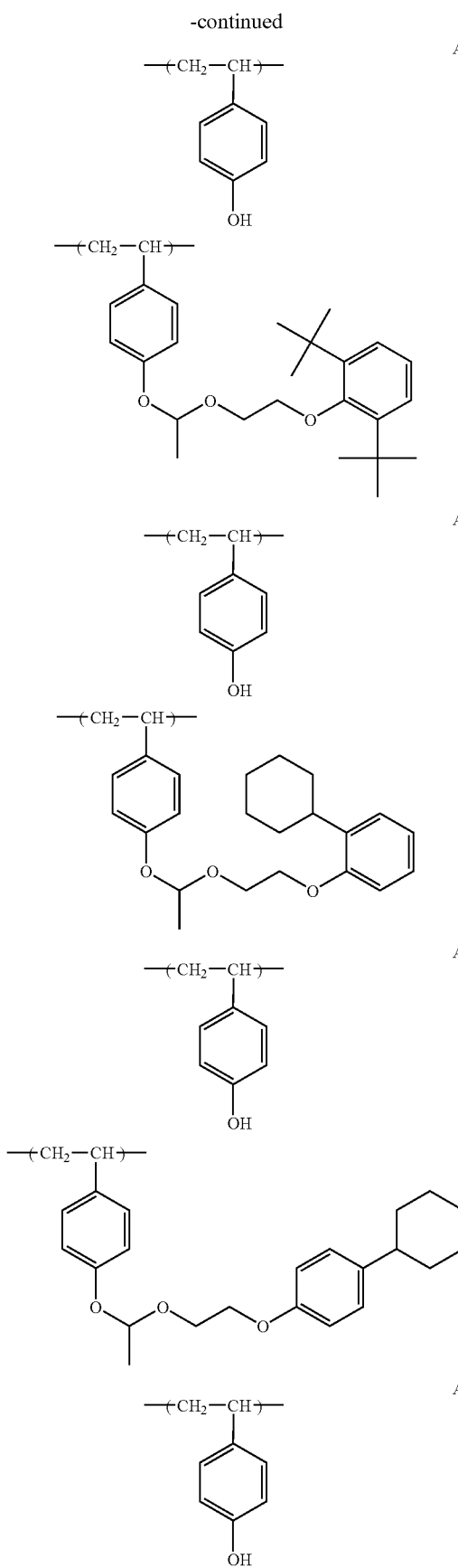
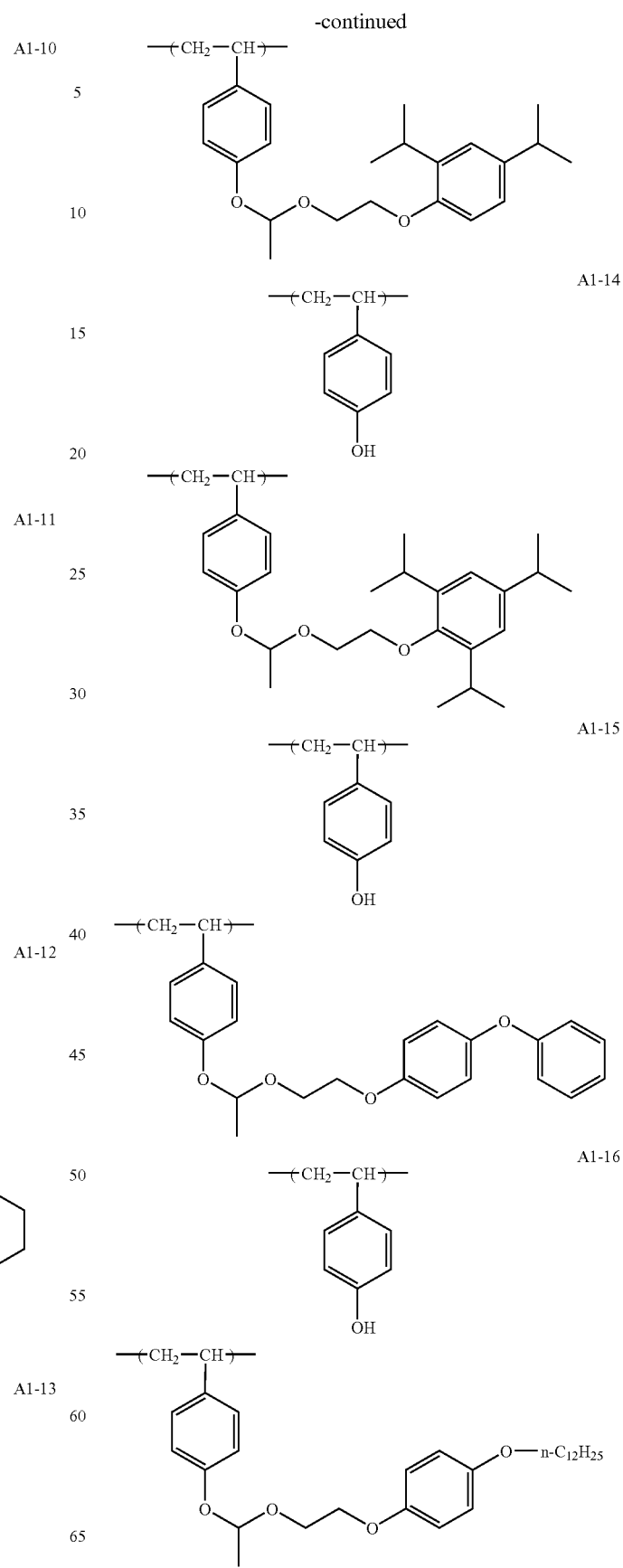

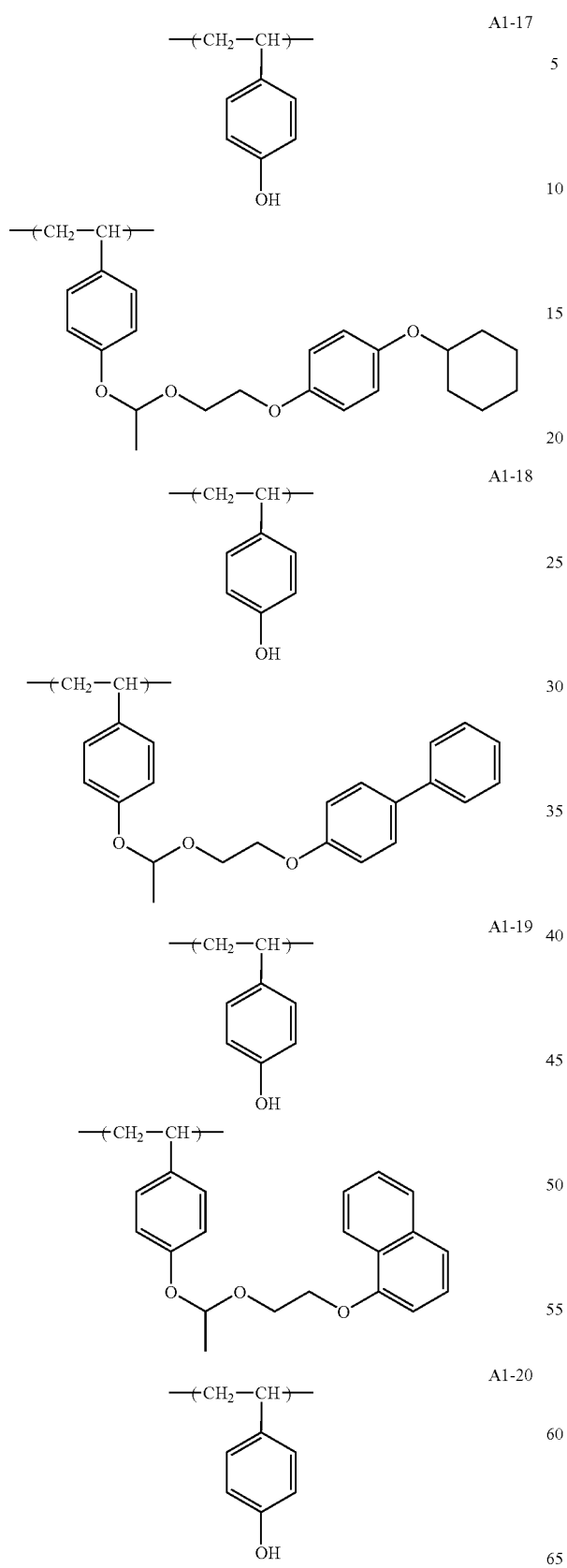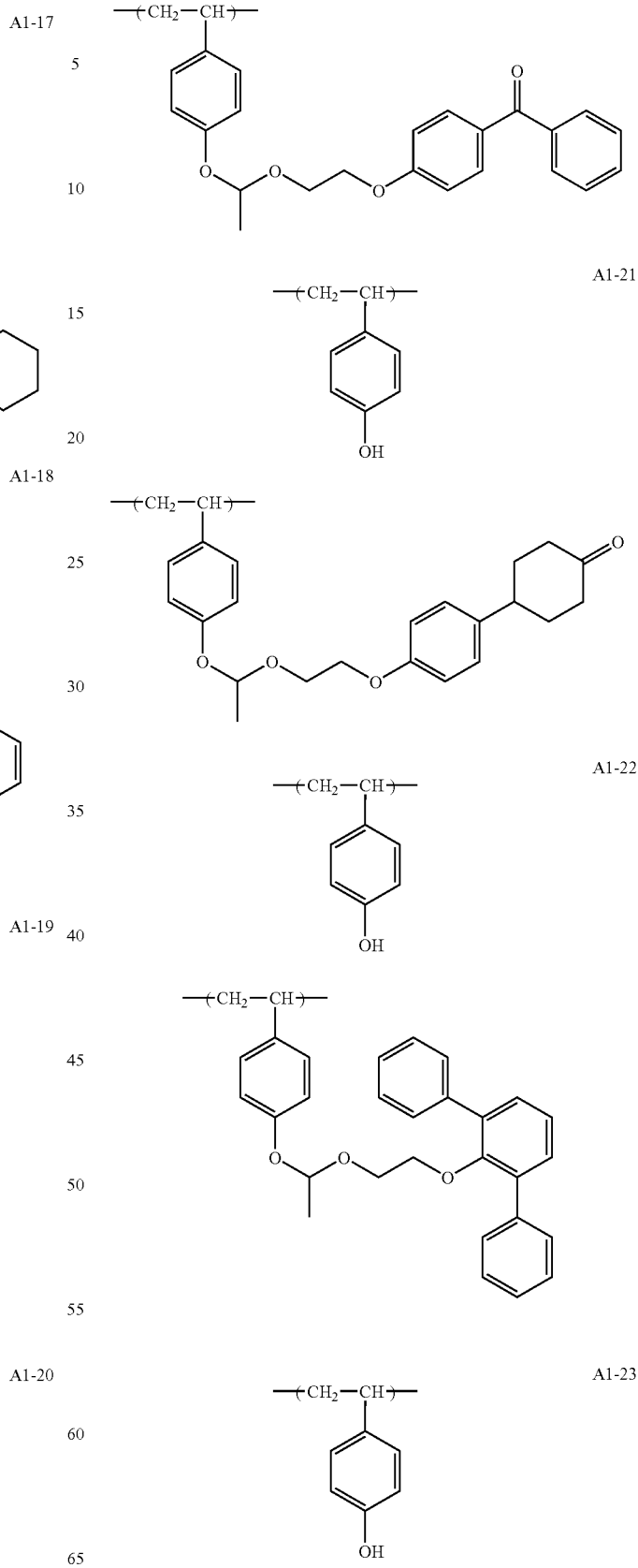

-continued
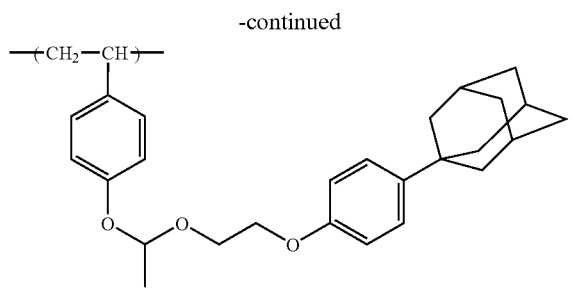
A1-24
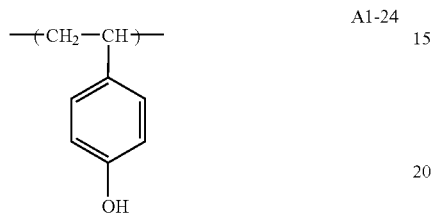
A1-25
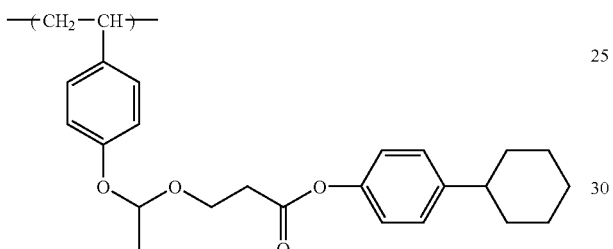
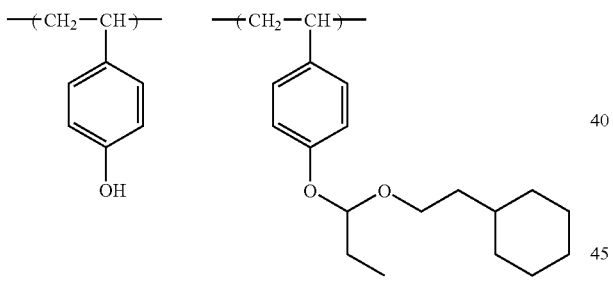
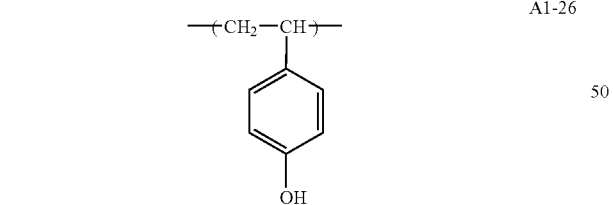
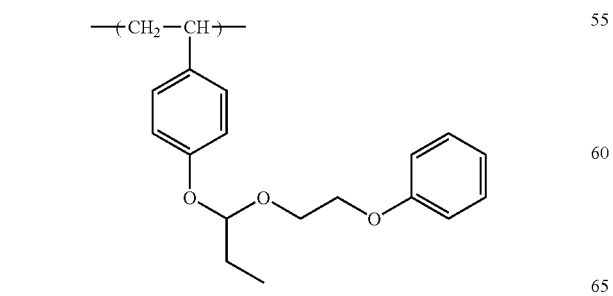
-continued
A1-27
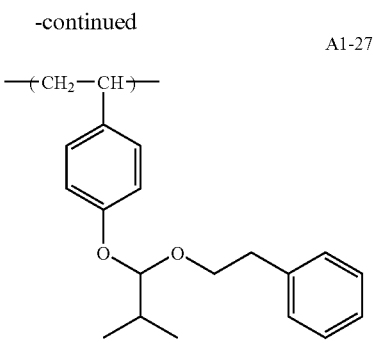
A1-28
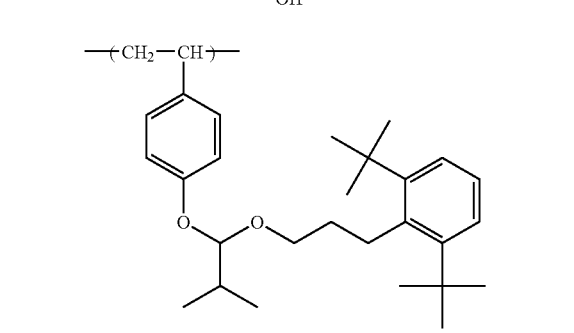
A1-29
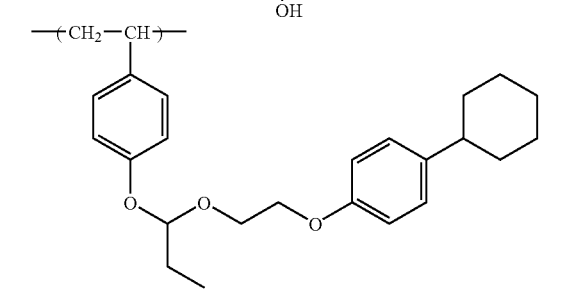
A1-30

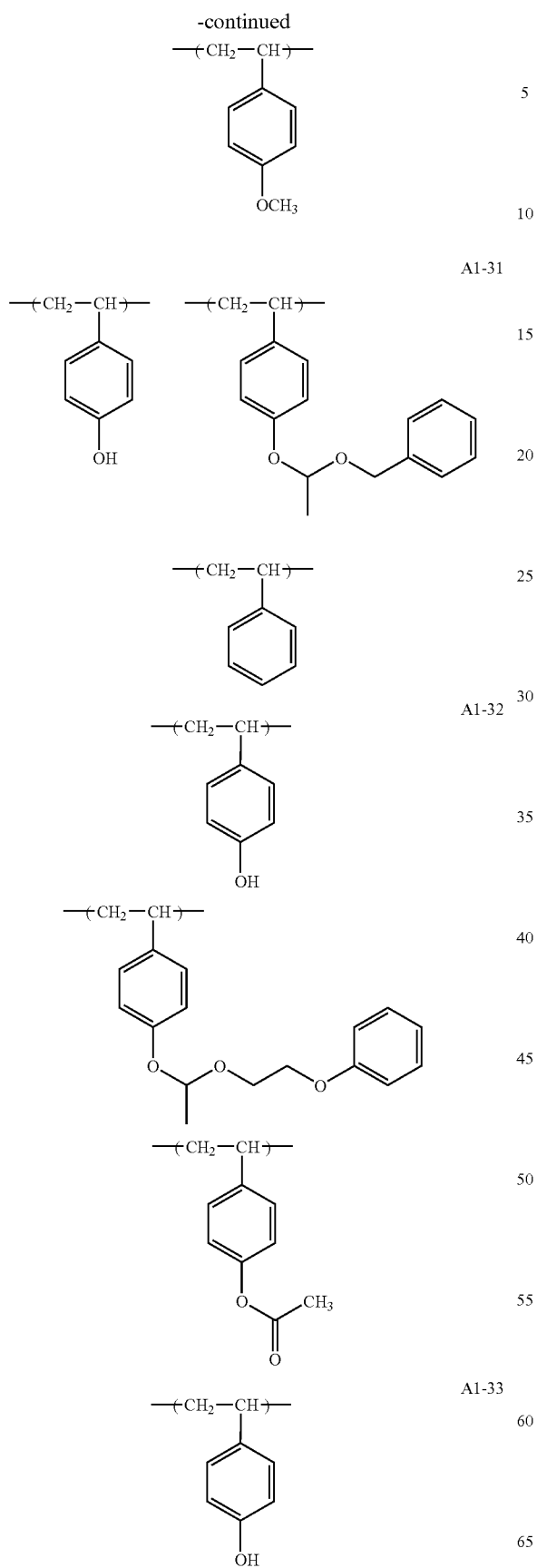
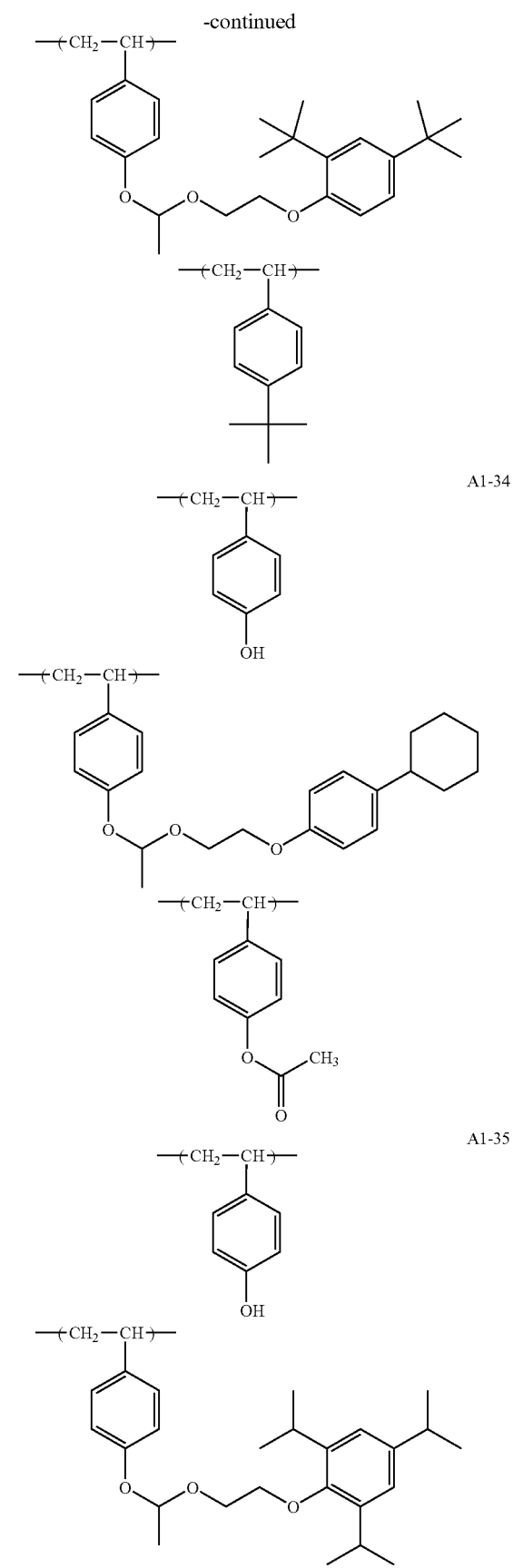

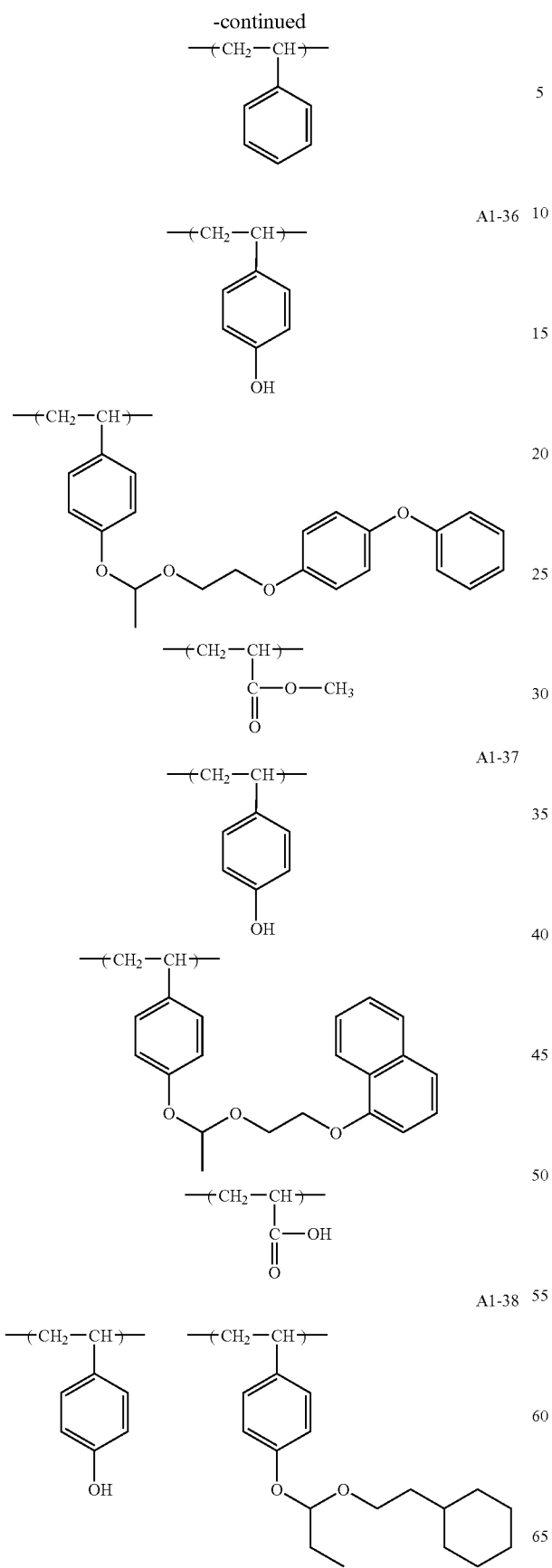
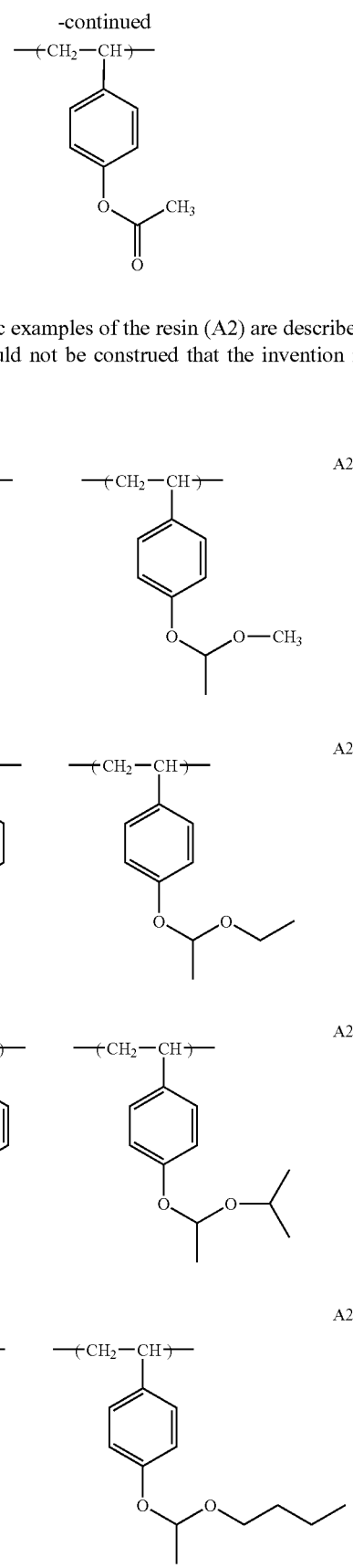
Further, specific examples of the resin (A2) are described below, but it should not be construed that the invention is limited thereto.

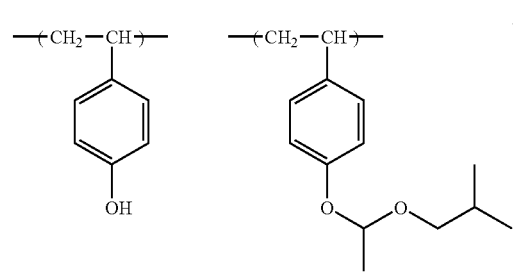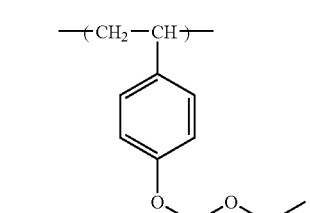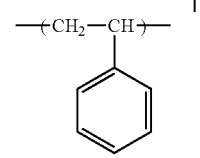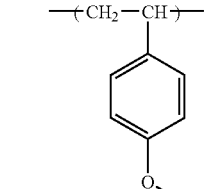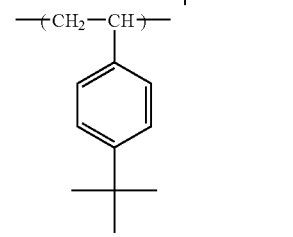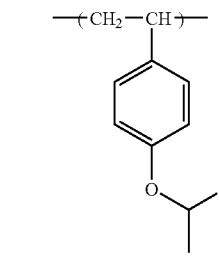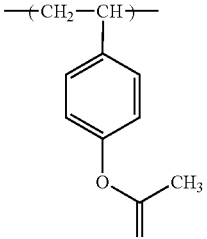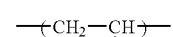

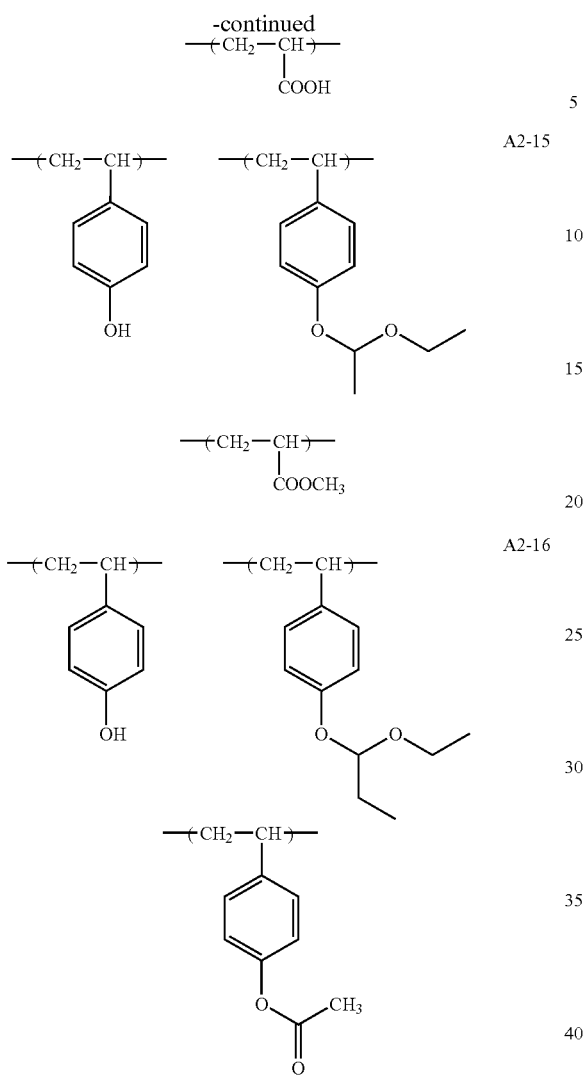

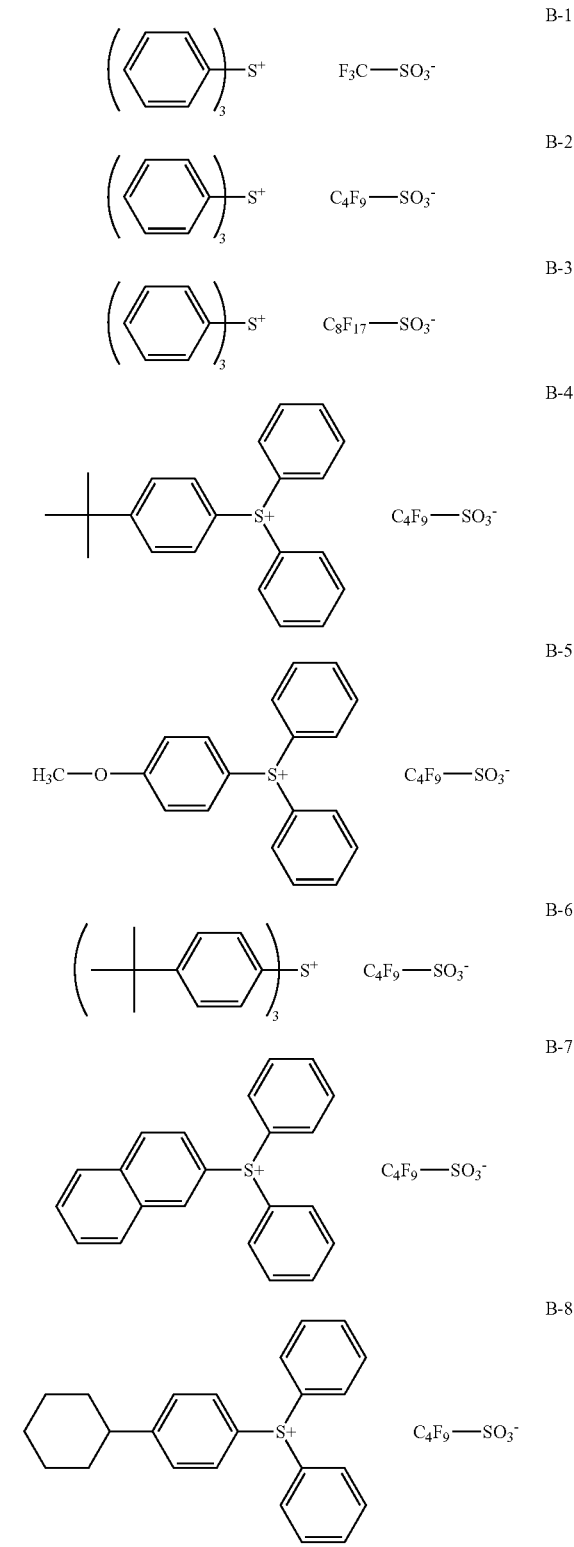

[2] (B) Compound capable of generating sulfonic acid upon irradiation with active rays or radiations:

The compound (B) is a compound capable of generating sulfonic acid upon irradiation with active rays, for example, X rays, electron beams, ion beams, and EUV or radiations (sulfonic acid generator), and known compounds can be properly selected and used as the compound (B). Examples thereof include a diazonium salt, a phosphonium salt, a sulfonium salt, an iodonium salt, an imidosulfonate, an oximesulfonate, a diazodisulfone, a disulfone and an o-nitrobenzyl sulfonate.

Also, compounds in which a group or compound capable of generating sulfonic acid upon irradiation with active rays or radiations is introduced into the main chain or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds capable of generating sulfonic acid by light as described in U.S. Pat. No. 3,779,778 and European Patent 126,712 can be used.

In the invention, a sulfonim salt, an iodonium salt, an imdosulfonate, an oximesulfonate, a diazodisulfone and a disulfone can be enumerated as the preferred sulfonic acid generator from the viewpoint of improving the image performance, for example, resolution and pattern shape.

Especially preferred examples thereof are described below.

-continued
B-9
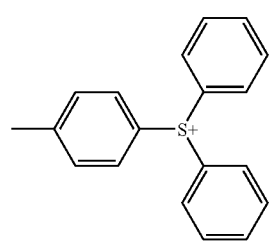 C₈F₁₇—SO₃⁻
B-10
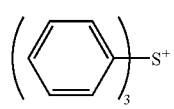 C₂F₅—O—CF₂CF₂—SO₃⁻
B-11
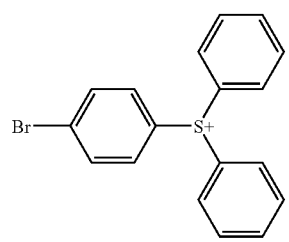 C₈F₁₇—SO₃⁻
B-12
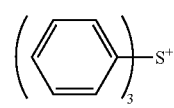
B-13
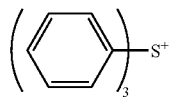 C₁₂H₂₅—⌬—SO₃⁻
B-14
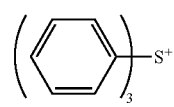
B-15
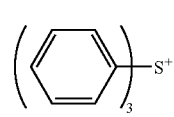
B-16
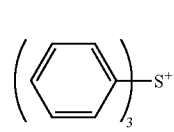
B-17
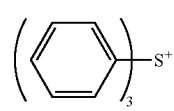
-continued
B-18
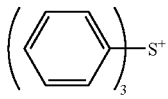 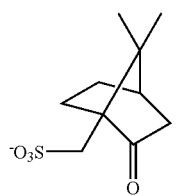
B-19
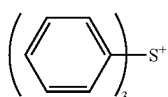 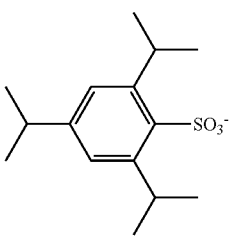
B-20
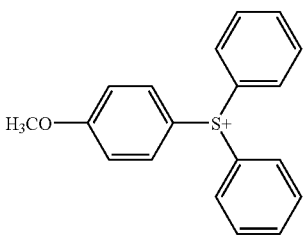 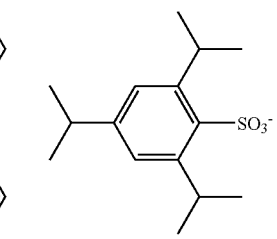
B-21
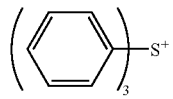 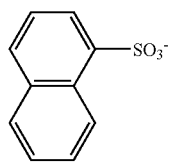
B-22
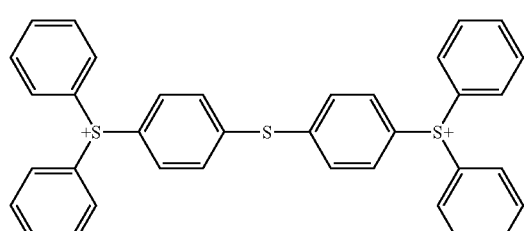
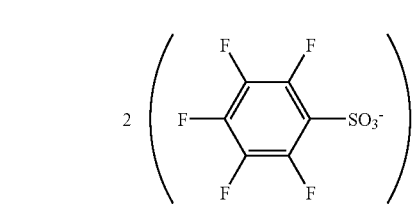
B-23
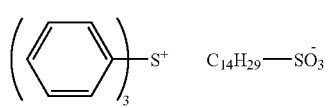 C₁₄H₂₉—SO₃⁻

-continued
B-24
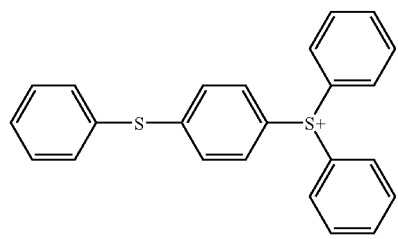
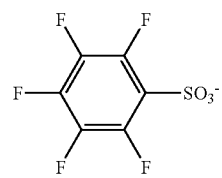
B-25
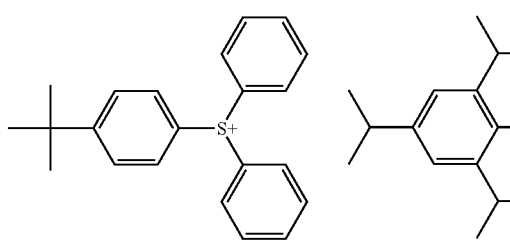
B-26
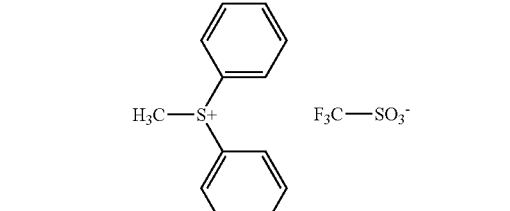
B-27
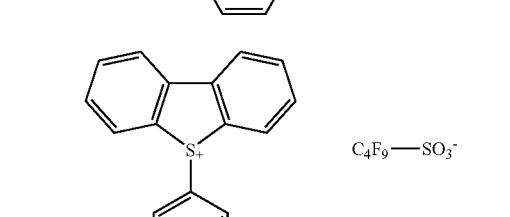
B-28
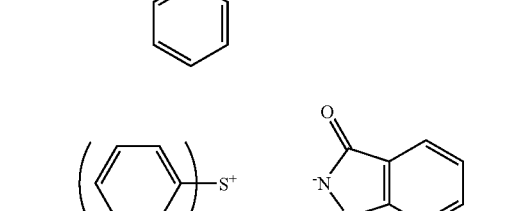
B-29
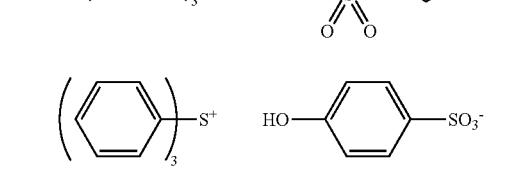
B-28a
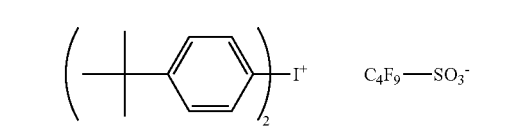
-continued
B29a
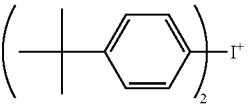 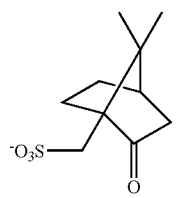
B-30
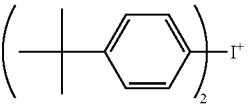 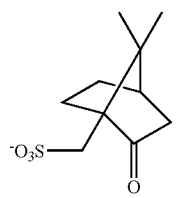
B-31
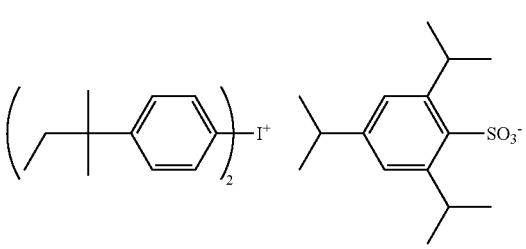
B-32
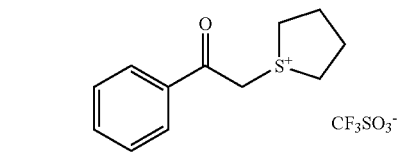
B-33
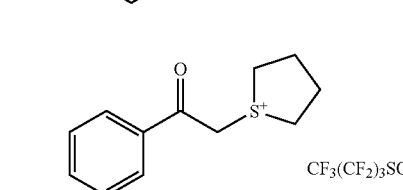
B-34
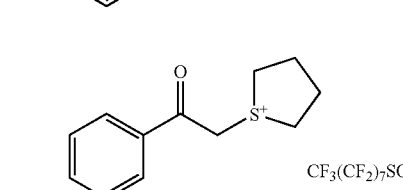
B-35
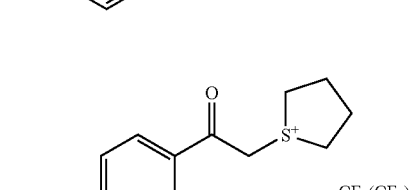
B-36
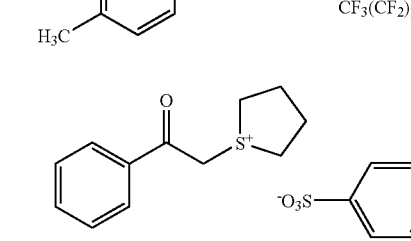

-continued
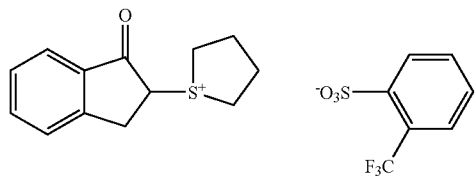 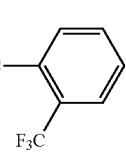
B-37
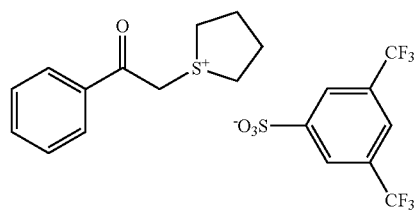
B-38
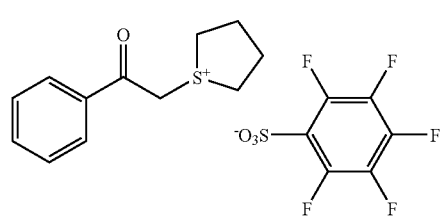
B-39
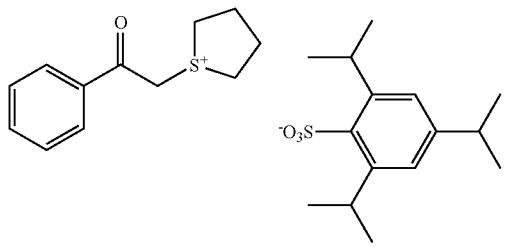
B-40
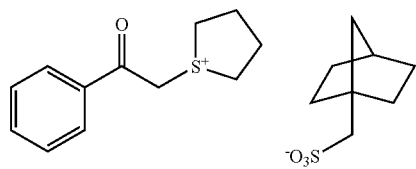
B-41
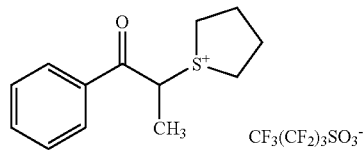
B-42
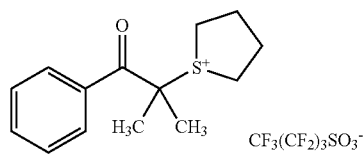
B-43
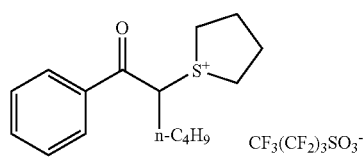
B-44
-continued
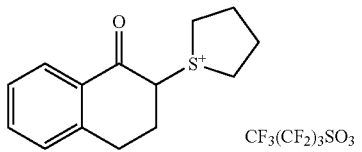
B-45
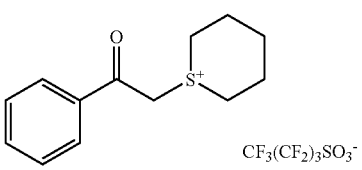
B-46
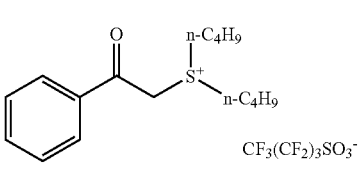
B-47
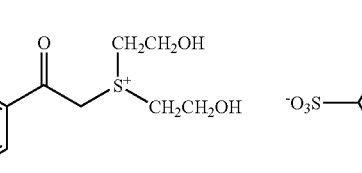
B-48
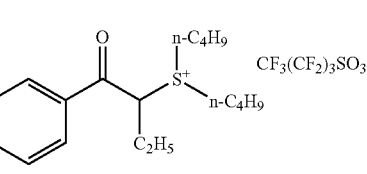
B-49
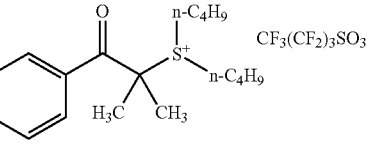
B-50
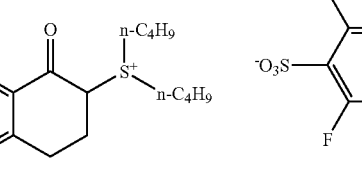
B-51
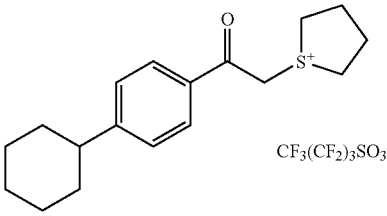
B-52

-continued
B-53
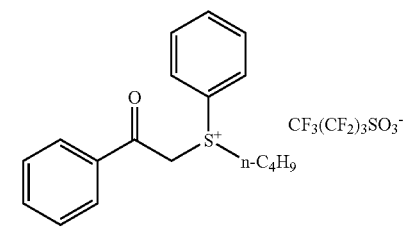
B-54
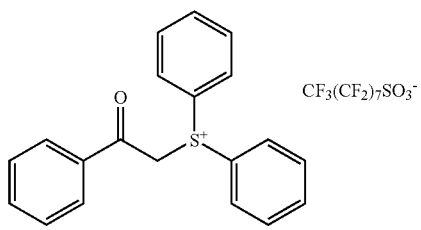
J-1
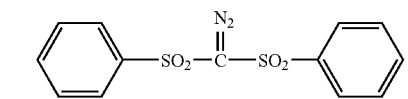
J-2
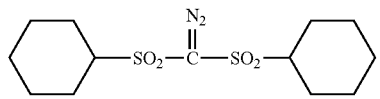
J-3
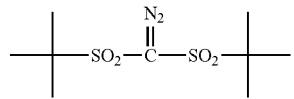
J-4
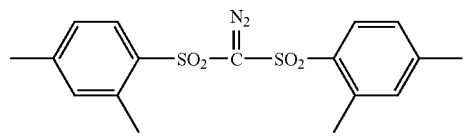
J-5
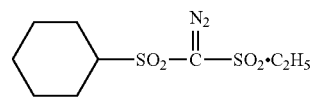
J-6
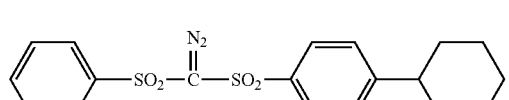
J-7
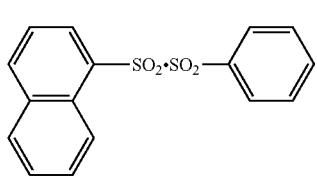
J-8
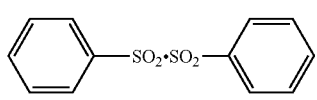
J-9
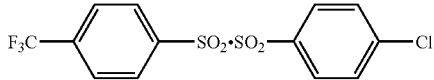
-continued
J-10
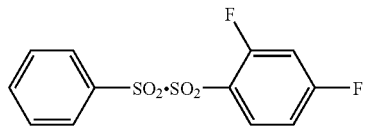
J-14
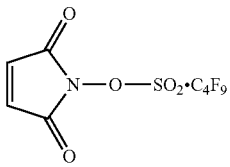
J-15
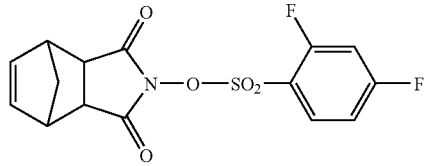
J-16
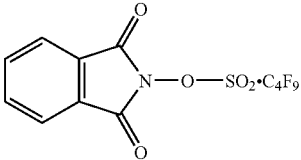
J-17
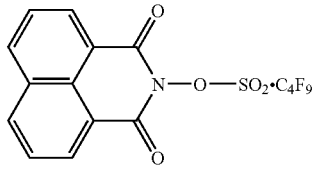
J-18
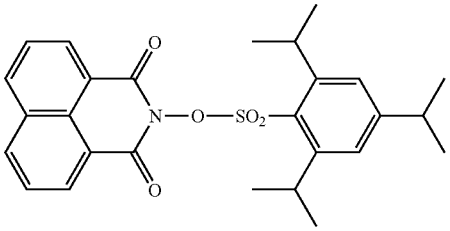
J-19
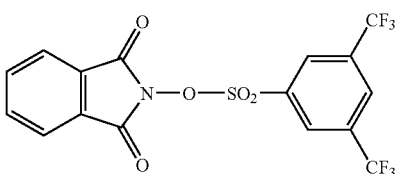
J-20
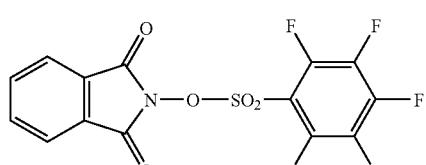
J-21
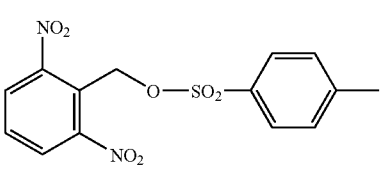

-continued

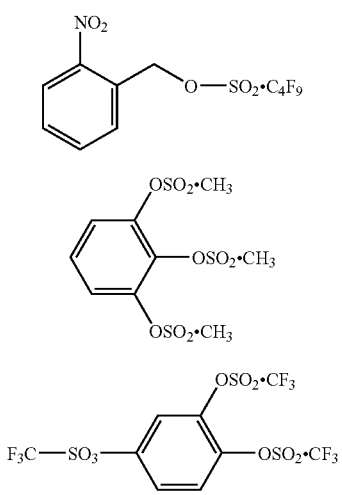

The content of the compound (B) is from 5 to 20% by weight, preferably from 6 to 18% by weight, and especially preferably from 7 to 16% by weight based on the solid content of the resist composition. The content of the compound (B) is ordinarily 5% by weight or more in view of sensitivity and line edge roughness, and it is ordinarily not more than 20% by weight in view of resolution, pattern shape and film quality. The compounds (B) may be used singly or in admixture of two or more thereof.

[3] (C) Nitrogen-containing basic compound:

In the invention, it is preferable to use a nitrogen-containing basic compound from the standpoints of improving the performance, for example, resolution and improving the storage stability.

A preferred nitrogen-containing basic compound that can be used in the invention is a compound having basicity stronger than phenol.

As a preferred chemical environment, structures of the following formulae (A) to (E) can be enumerated. Each of formulae (B) to (E) may be a part of the ring structure.

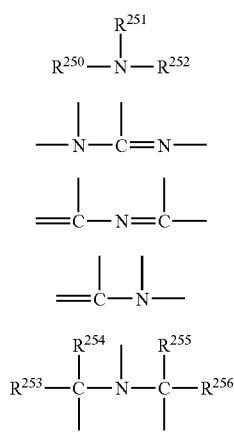

In the above formulae, $R^{250}$, $R^{251}$, and $R^{252}$, which may be the same or different, d each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms; or $R^{251}$ and $R^{252}$ may be taken together to form a ring.

$R^{253}$, $R^{254}$, $R^{255}$ and $R^{256}$, which may be the same or different, each represent an alkyl group having from 1 to 6 carbon atoms.

The compound is more preferably a nitrogen-containing basic compound having two or more nitrogen atoms having a different chemical environment from each other in one molecule, and especially preferably a compound having both a substituted or unsubstituted amino group and a ring structure containing a nitrogen atom or a compound having an alkylamino group.

Preferred examples thereof include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted piperidines, substituted or unsubstituted aminomorpholines and substituted or unsubstituted aminoalkylmorpholines. Preferred examples of substituents include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Especially preferred examples of the compound include quanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperdinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

Also, a nitrogen-containing basic compound of a tetraalkylammonium salt type can be used. Of these, a tetraalkylammonium hydroxide having from 1 to 8 carbon atoms (for example, tetramethylammonium hydroxide, tetraethylammonium hydroxide or tetra-(n-butyl)ammonium hydroxide) is especially preferable.

The nitrogen-containing basic compounds may be used singly or in admixture of two or more thereof.

With respect to the proportion of the acid generator to the nitrogen-containing basic compound used, it is preferable that a molar ratio of (total amount of acid generator)/(nitrogen-containing basic compound) is 2.5 to 300. When the molar ratio is less than 2.5, the sensitivity decreases, and the resolution may possibly decrease. On the other hand, when it exceeds 300, the width of resist pattern increases with time after exposure until heat treatment, and the resolution may possibly decrease. The molar ratio of (total amount of acid generator)/(nitrogen-containing basic compound) is more preferably from 5.0 to 200, and still more preferably from 7.0 to 150.

[4] (D) Compound capable of generating a carboxylic acid upon irradiation with active rays or radiations:

In the invention, it is preferable to use a compound capable of generating a carboxylic acid upon irradiation with active rays or radiations (carboxylic acid generator) together with the sulfonic acid generator from the standpoint of improving the performance, for example, sensitivity and resolution.

As the carboxylic acid generator, a compound represented by the following formula (D) is preferable.

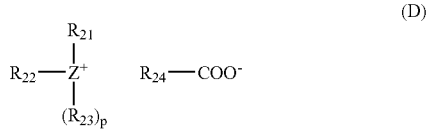

In formula (D), $R_{21}$ to $R_{23}$ each independently represent an alkyl group, an alkenyl group or an aryl group; $R_{24}$ represents a hydrogen atom, an alkyl group, an alkenyl group, or an aryl group; and Z represents a sulfur atom or an iodine atom. In the case where Z represents a sulfur atom, p is 1; and in the case where Z represents an iodine atom, p is 0.

In formula (D), $R_{21}$ to $R_{23}$ each independently represent an alkyl group, an alkenyl group or an aryl group, and these groups may have a substituent.

The alkyl group, alkenyl group or aryl group as $R_{21}$ to $R_{23}$ includes those having a substituent.

Examples of the substituent for the alkyl group or alkenyl group include a halogen atom (for example, a chlorine atom, a bromine atom or a fluorine atom), an aryl group (for example, a phenyl group or a naphthyl group), a hydroxyl group, and an alkoxy group (for example, a methoxy group, an ethoxy group or a butoxy group).

Examples of the substituent of the aryl group include a halogen atom (for example, a chlorine atom, a bromine atom or a fluorine atom), a nitro group, a cyano group, an alkyl group (for example, a methyl group, an ethyl group, a tert-butyl group, a tert-amyl group or an octyl group), a hydroxyl group, and an alkoxy group (for example, a methoxy group, an ethoxy group or a butoxy group).

$R_{21}$ to $R_{23}$ each independently preferably represent an alkyl group having from 1 to 12 carbon atoms, an alkenyl group having from 2 to 12 carbon atoms or an aryl group having from 6 to 24 carbon atoms; more preferably an alkyl group having from 1 to 6 carbon atoms or an aryl group having from 6 to 18 carbon atoms; and especially preferably an aryl group having from 6 to 15 carbon atoms. These groups may each have a substituent.

$R_{24}$ represents a hydrogen atom, an alkyl group, an alkenyl group or an aryl group.

The alkyl group, alkenyl group or aryl group as $R_{24}$ includes those having a substituent.

As examples of the substituent for the alkyl group or alkenyl group, those enumerated as examples of the substituent in the case where $R_2$ represents an alkyl group are enumerated. As examples of the substituent for the aryl group, those enumerated as examples of the substituent in the case where $R_{21}$ represents an aryl group are enumerated.

$R_{24}$ preferably represents a hydrogen atom, an alkyl group having from 1 to 30 carbon atoms, an alkenyl group having from 2 to 30 carbon atoms, or an aryl group having from 6 to 24 carbon atoms; more preferably an alkyl group having from 1 to 18 carbon atoms or an aryl group having from 6 to 18 carbon atoms; and especially preferably an alkyl group having from 1 to 12 carbon atoms or an aryl group having from 6 to 15 carbon atoms. These groups may each have a substituent.

Z represents a sulfur atom or an iodine atom. In the case where Z represents a sulfur atom, p is 1; and in the case where Z represents an iodine atom, p is 0.

Two or more cation moieties of the formula (D) may be taken together through a single bond or a connecting group (for example, —S— or —O—), to form a cation structure having a plurality of the cation moieties of the formula (D).

Preferred examples of the compound (D) capable of generating a carboxylic acid upon irradiation with active rays or radiations are described below, but it should not be construed that the invention is limited thereto.

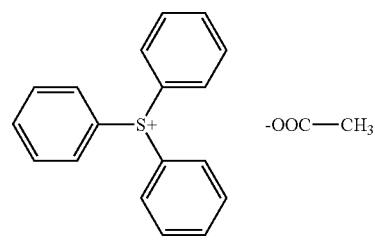

D-1

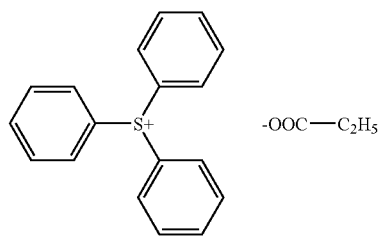

D-2

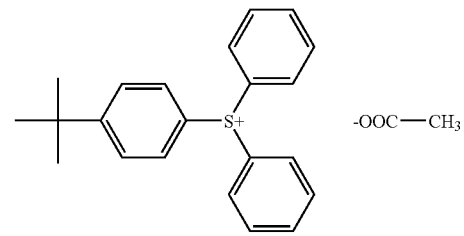

D-3

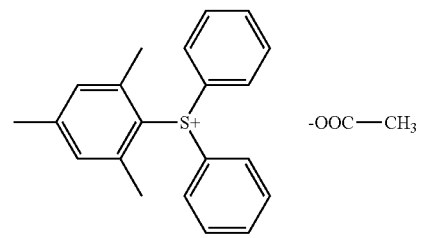

D-4

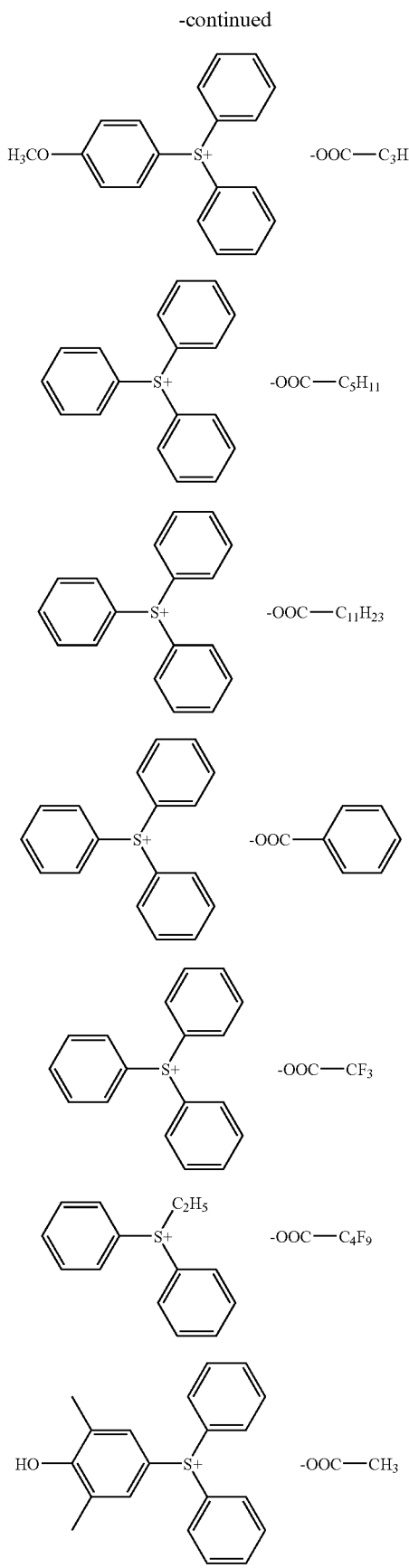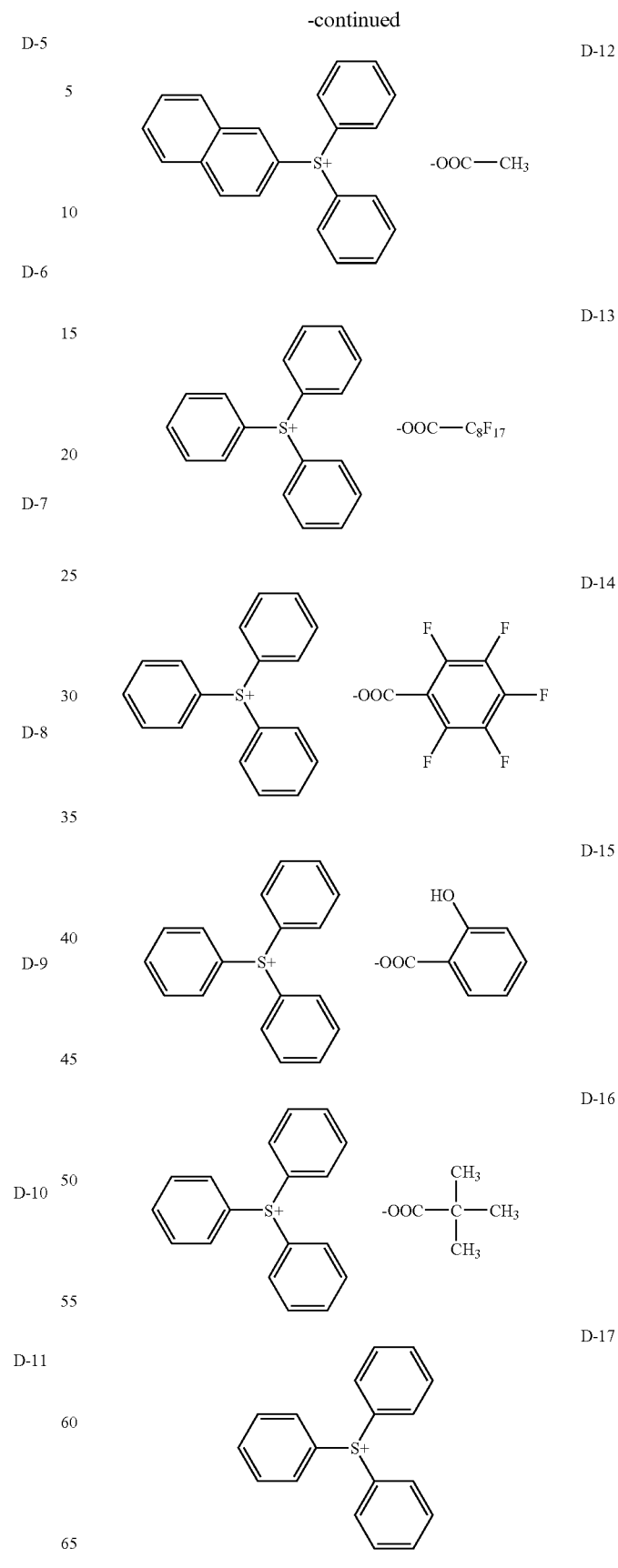

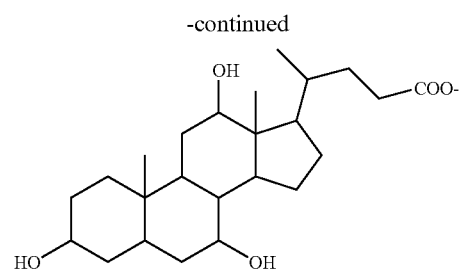

D-18

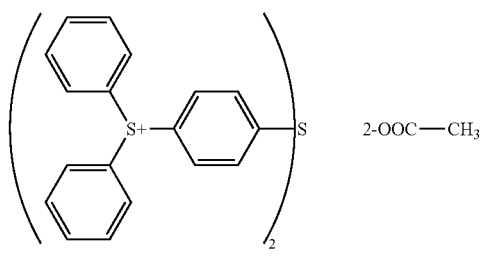

D-19

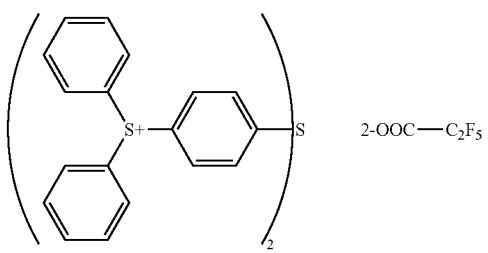

D-20

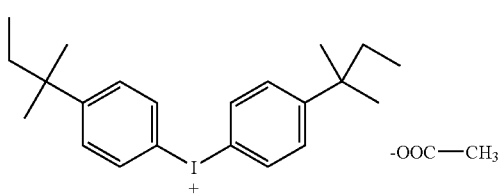

D-21

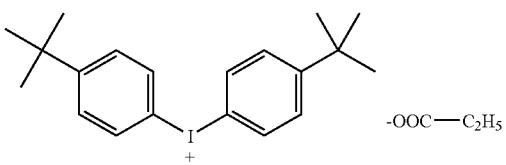

D-22

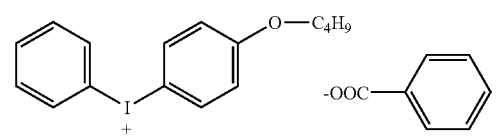

D-23

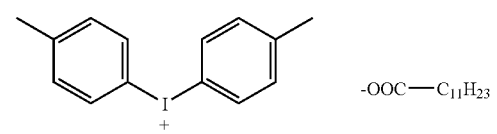

D-24

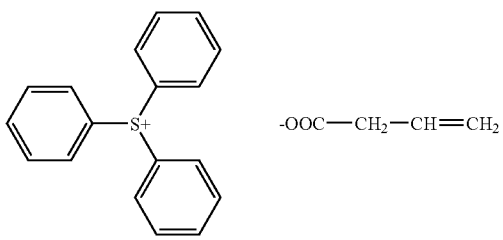

D-25

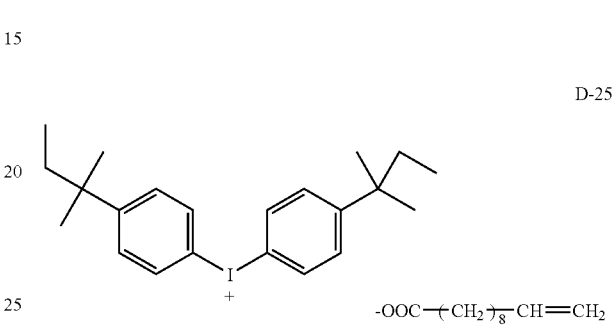

The content of the compound (D) capable of generating a carboxylic acid upon irradiation with active rays or radiations in the positive working resist composition of the invention is preferably from 0.01 to 10% by weight, more preferably from 0.03 to 5% by weight, and especially preferably from 0.05 to 3% by weight based on the total solid content of the composition. The compounds capable of generating a carboxylic acid upon irradiation with active rays or radiations may be used singly or in admixture of two or more thereof.

A weight ratio of the compound (D) capable of generating a carboxylic acid upon irradiation with active rays or radiations/the compound (B) capable of generating sulfonic acid is usually from 0.1/99.9 to 50/50, preferably 1/99 to 40/60, and especially preferably from 2/98 to 30/70.

[5] Surfactant:

In the invention, a surfactant can be used, and such is preferable from the viewpoints of film forming property, adhesion of pattern, reduction of development defect, etc.

Specific examples of the surfactant include nonionic surfactants such as polyoxyethylene alkyl ethers (for example, polyoxyethylene lauryl ether, polyoxyethylene stearyl ether, polyoxyethylene cetyl ether or polyoxyethylene oleyl ether), polyoxyethylene alkylaryl ethers (for example, polyoxyethylene octylphenyl ether or polyoxyethylene nonylphenyl ether), polyoxyethylene-polyoxypropylene block copolymers, sorbitan fatty acid esters (for example, sorbitan monolaurate, sorbitan monopalmitate, sorbitan monostearate, sorbitan monooleate, sorbitan trioleate or sorbitan tristearate) and polyoxyethylene sorbitan fatty acid esters (for example, polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate); fluorine based surfactants or silicon based surfactants, for example, Eftop EF301, Eftop EF303 or Eftop EF352 (all of which are manufactured by Jemco Inc.), Megafac F171 or Megafac F173 (all of which are manufactured by Dainippon Ink and Chemicals, Incorporated), Fluorad FC430 or Fluorad FC431 (all of which are manufactured by Sumitomo 3M Limited), Asahi Guard AG710, Surflon S-382, Surflon SC101, Surflon SC102, Surflon SC103, Surflon SC104, Surflon SC105 or Surflon SC106 (all of which are manufactured by Asahi Glass Co., Ltd.) and Troysol S-366 (manudactured by Troy Chemical Industries, Inc.); an organosiloxane polymer, KP341 (manufactured by Shin-Etsu Chemical Co., Ltd.) and acrylic acid based or methacrylic acid based (co)polymers (for example, Polyflow No. 75 or Polyflow No. 95, all of which are manufactured by Kyoeisha Chemical Co., Ltd.). The amount of the surfactant is usually not more than 2 parts by weight, and preferably not more than 1 part by weight based on 100 parts by weight of the solid content of the composition of the invention.

The surfactants may be used singly or in combination.

It is preferable to contain either one or two or more kinds of fluorine based and/or silicon based surfactants (including a fluorine based surfactant, a silicon based surfactant, and a surfactant containing both a fluorine atom and a silicon atom) as the surfactant.

As the surfactants, surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and U.S. Pat No. 5,824,451 can be enumerated. Further, the following commercially available surfactants can be used as they are.

Examples of the commercially available surfactant that can be used include fluorine based surfactants or silicon based surfactants, for example, Eftop EF301 or Eftop EF303 (all of which are manufactured by Jemco Inc.), Fluorad FC430 or Fluorad FC431 (all of which are manufactured by Sumitomo 3M Limited), Megafac F171, Megafac F173, Megafac F176, Megafac F189 or Megafac R08 (all of which are manufactured by Dainippon Ink and Chemicals, Incorporated), Surflon S-382, Surflon SC101, Surflon SC102, Surflon SC103, Surflon SC104, Surflon SC105 or Surflon SC106 (all of which are manufactured by Asahi Glass Co., Ltd.) and Troysol S-366 (manudactured by Troy Chemical Industries, Inc.). Also, Polysiloxane Polymer KP-341 (manufactured by Shin-Etsu Chemical Co., Ltd.) can be used as the silicon based surfactant.

Besides the foregoing known surfactants, surfactants using a polymer containing a fluoro aliphatic group derived from fluoro aliphatic compounds produced by the telomerization process (also called the telomer process) or the oligomerization process (also called the oligomer process) can also be used as the surfactant. The fluoro aliphatic compounds can be synthesized by the process described in JP-A-2002-90991.

As the polymer containing a fluoro aliphatic group, copolymers of a fluoro aliphatic group-containing monomer and a (poly(oxyalkylene)) acrylate and/or a (poly(oxyalkylene)) methacrylate are preferable. The segments may be irregularly copolymerized or block copolymerized. Examples of the poly(oxyalkylene) group include a poly (oxyethylene) group, a poly(oxypropylene) group and a poly(oxybutylene) group. Also, units containing alkylenes having a different chain length in the same chain, for example, a poly(block connecting body of oxyethylene, oxypropylene and oxyethylene) group and a poly(block connecting body of oxyethylene and oxypropylene) group may be used. Further, the copolymer of a fluoro aliphatic group-containing monomer and a (poly(oxyalkylene)) acrylate (or methacrylate) includes not only binary copolymers but also ternary or multi-component copolymers prepared by copolymerizing two or more different fluoro aliphatic group-containing monomers or two or more different (poly(oxyalkylene)) acrylates (or methacrylates).

Examples of commercially available surfactants include Megafac F178, Megafac F-470, Megafac F-473, Megafac F-475, Megafac F-476 or Megafac F-472 (all of which are manufactured by Dainippon Ink and Chemicals, Incorporated). Also, copolymers of a $C_6F_{13}$ group-containing acrylate (or methacrylate) and a (poly(oxyalkylene)) acrylate (or methacrylate), copolymers of a $C_6F_{13}$ group-containing acrylate (or methacrylate), (poly(oxyethylene)) acrylate (or methacrylate) and (poly(oxypropylene)) acrylate (or methacrylate), copolymers of a $C_8F_{17}$ group-containing acrylate (or methacrylate) and a (poly(oxyalkylene)) acrylate (or methacrylate), and copolymers of a $C_8F_{17}$ group-containing acrylate (or methacrylate), (poly(oxyethylene)) acrylate (or methacrylate) and (poly(oxypropylene)) acrylate (or methacrylate) can be enumerated.

The amount of the surfactant used is preferably from 0.0001 to 2% by weight, and more preferably from 0.001 to 1% by weight based on the total amount of the positive resist composition (excluding the solvent).

[6] Other components:

If desired, the positive working resist composition of the invention can contain a dyestuff, a photo-base generator, etc.

1. Dyestuff:

In the invention, a dyestuff can be used.

Suitable dyestuffs include oily dyestuffs and basic dyestuffs. Specifically, Oil Yellow #101, Oil Yellow #103, Oil Pink #312, Oil Green BG, Oil Blue BOS, Oil Blue #603, Oil Black BY, Oil Black BS, and Oil Black T-505 (all of which are manufactured by Orient Chemical Industries, Ltd.), Crystal Violet (CI42555), Methyl Violet (CI42535), Rhodamine B (CI45170B), Malachite Green (CI42000) and Methylene Blue (CI52015) can be enumerated.

2. Photo-base generator:

As the photo-base generator that can be added in the composition of the invention, compounds described in JP-A-4-151156, JP-A-4-162040, JP-A-5-197148, JP-A-5-5995, JP-A-6-194834, JP-A-8-146608, JP-A-10-83079 and European Patent 622,682 can be enumerated. Specifically, 2-nitrobenzyl carbamate, 2,5-dinitrobenzylcyclohexyl carbamate, N-cyclohexyl-4-methylphenyl sulfonamide and 1,1-dimethyl-2-phenylethyl-N-isopropyl carbamate can be suitably used. The photo-base generator is added for the purpose of improving the resist shape, etc.

3. Solvent:

The resist composition of the invention is dissolved in a solvent capable of dissolving the foregoing respective components and coated on a support. Usually, the concentration of the solid content of the resist component is preferably from 2 to 30% by weight, and more preferably from 3 to 25% by weight.

As the solvent used, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran are preferable. The solvents may be used singly or in admixture.

The resist composition of the invention is coated on a substrate to form a thin film. The coated film preferably has a film thickness of from 0.05 to 4.0 μm.

In the invention, a known inorganic or organic anti-reflective coating can be used, if desired. Further, an anti-reflective coating can also be coated on the resist layer.

As the anti-reflective coating used as an under layer of the resist, any of inorganic film types of titanium, titanium dioxide, titanium nitride, chromium oxide, carbon, amorphous silicon or the like and organic film types comprising a light absorber and a polymer material can be used. The former requires equipment, for example, a vacuum vapor deposition device, a CVD device or a sputtering device in the film formation. Examples of the organic anti-reflective coating include anti-reflective coating comprising a condensate of a diphenylamine derivative and a formaldehyde-modified melamine resin, an alkali-soluble resin and a light absorber as described in JP-B-7-69611; anti-reflective coating comprising a reaction product of a maleic anhydride copolymer and a diamine type light absorber as described in U.S. Pat. No. 5,294,680; anti-reflective coating comprising a resin binder and a methylolmelamine based thermal crosslinking agent as described in JP-A-6-118631; acrylic resin type anti-reflective coating containing a carboxylic acid group, an epoxy group and a light absorbing group in the same molecule, as described in JP-A-6-118656; anti-reflective coating comprising methylolmelamine and a benzophenone based light absorber as described in JP-A-8-87115; and anti-reflective coating comprising a polyvinyl alcohol resin having a low-molecular light absorber added thereto as described in JP-A-8-179509.

Also, commercially available anti-reflective coating, for example, DUV30 Series manufactured by Brewer Science, Inc. and AR-2, AR-3 or AR-5, all of which are manufactured by Shipley Company, LLC can be used as the organic anti-reflective coating.

In the production of precision integrated circuit devices, the pattern formation step on the resist film is carried out by coating the positive working resist composition of the invention on a substrate (for example, silicon/silicon dioxide-coated substrate, glass substrate, ITO substrate or quartz/chromium oxide-coated substrate), irradiating the coated resist composition with X rays, electron beams, ion beams or EUV beams, heating, developing, rinsing and drying, whereby a good resist pattern can be formed.

As the alkali developing solution for the resist composition of the invention, an aqueous solution of alkali (usually in an amount of from 0.1 to 20% by weight), for example, inorganic alkali (for example, sodium hydroxide, potassium hydroxide, sodium carbonate, sodium silicate, sodium metasilicate or aqueous ammonia), primary amine (for example, ethylamine or n-propylamine), secondary amine (for example, diethylamine or di-n-butylamine), tertiary amine (for example, triethylamine or methyldiethylamine), alcoholamine (for example, diethanolamine or triethanolamine), quaternary ammonium salt (for example, tetramethylammonium hydroxide, tetraethylammonium hydroxide or choline) and cyclic amine (for example, pyrrole or piperidine) can be used. Further, a developing solution prepared by adding an appropriate amount of an alcohol, for example, isopropyl alcohol or a surfactant, for example, a nonionic surfactant to the foregoing aqueous solution of alkali can be used.

Of the developing solutions, those containing a quaternary ammonium salt are preferable and those containing tetramethylammonium hydroxide or choline are more preferable.

The invention will be described below in more detail with reference to the following Examples, but it should not be construed that the contents of the invention are limited thereto.

1. SYNTHESIS EXAMPLES OF CONSTITUTIONAL MATERIALS (i) Synthesis of Resin:

Synthesis Example 1 of Polymer (A1-3)

1-1: Synthesis of Vinyl Ether

Ethyl vinyl ether was mixed in benzyl alcohol, to which was then added mercury acetate, and the mixture was stirred at room temperature for 12 hours. The reaction mixture was extracted with ethyl acetate and the ethyl acetate extract was washed with water, followed by distillation in vacuo to obtain benzyl vinyl ether.

1-2: Synthesis of Acetal Polymer

Twenty grams of poly(p-hydroxystyrene) (VP-8000, manufactured by Nippon Soda Co., Ltd.) and 5.7 g of the foregoing vinyl ether were dissolved in 100 ml of THF, to which was then added 0.01 g of p-toluenesulfonic acid, and the mixture was reacted at room temperature for 18 hours. The reaction solution was added dropwise to 5 liters of distilled water with stirring, and the deposited powder was corrected by filtration and dried to obtain Polymer (A-3). An acetalization rate (molar ratio) of the resulting polymer was measured by NMR and found to be 0.24. Also, the polymer had a weight average molecular weight of 9,600.

Synthesis Example 2

Synthesis of Polymer (A1-34)

2-1: Synthesis of Vinyl Ether

In 300 ml of toluene, 83.1 g (0.5 moles) of p-cyclohexylphenol was dissolved, to which were then added 150 g of 2-chloroethyl vinyl ether, 25 g of sodium hydroxide, 5 g of tetrabutylammonium bromide and 60 g of triethylamine, and the mixture was reacted at 120° C. for 5 hours. The reaction solution was washed with water, the excessive 2-chloroethyl vinyl ether and toluene were distilled off, and the resulting oil was purified by distillation in vacuo to obtain 4-cyclohexylphenoxyethyl vinyl ether.

2-2: Synthesis of Acetal Polymer

Twenty grams of poly(p-hydroxystyrene) (VP-8000, manufactured by Nippon Soda Co., Ltd.) and 6 g of the foregoing vinyl ether were dissolved in 100 ml of tetrahydrofuran (THF), to which was then added 0.01 g of p-toluenesulfonic acid, and the mixture was reacted at room temperature for 18 hours. Further, 1.5 g of acetic anhydride and 1.5 g of pyridine were added to the reaction solution, and the mixture was stirred at room temperature for one hour. The reaction solution was added dropwise to 5 liters of distilled water with stirring, and a deposited powder was collected by filteration and dried to obtain Polymer (A-34). An acetalization rate and an acetylation rate of the resulting polymer were measured by NMR and found to be 0.15 and 0.08, respectively. Also, the polymer had a weight average molecular weight of 9,500.

Other resins were synthesized in the same manner.

(ii) Synthesis of Sulfonic Acid Generator:

Any of the sulfonic acid generators used in the Examples of the invention were synthesized according to known synthesis methods.

Example 1

(i) Preparation and Coating of Positive Working Resist:

| (Component A): Resin (A1-3) | 0.92 g |
|---|---|
| (Component B): Sulfonic Acid Generator B-2 | 0.08 g |

The above components were dissolved in 8.5 g of propylene glycol monomethyl ether acetate to prepare a solution. Separately, 0.003 g of D-1 (described below) as a nitrogen-containing basic compound was dissolved in 7.0 g of propylene glycol monomethyl ether acetate and 1.5 g of propylene glycol monomethyl ether to prepare a solution. The solutions were mixed and 0.001 g of Megafac F176 (manufactured by Dainippon Ink and Chemicals, Incorporated, hereinafter abbreviated as "W-1") wad added thereto and dissolved. The resulting solution was subjected to precision filtration with a membrane filter having a pore size of 0.1 μm to obtain a resist solution. The content of the resin and the sulfonic acid generator in the resist was 91.6% by weight and 8.0% by weight, respectively based on the solid content of the resist.

The resist solution was coated on a 6-inch silicon wafer using a spin coater, Mark 8 (manufactured by Tokyo Electron Limited) and baked at 110° C. for 90 seconds to obtain a uniform film having a film thickness of 0.30 μm.

(ii) Preparation and Evaluation of Positive Working Resist Pattern:

The resist film was irradiated with electron beams using an electron beam drawing apparatus (HL750, manufactured by Hitachi, Ltd., acceleration voltage: 50 keV). After the irradiation, the resist film was baked at 110° C. for 90 seconds, immersed in a 2.38% by weight tetramethylammonium hydroxide (TMAH) aqueous solution for 60 seconds, and then rinsed with water for 30 seconds, followed by drying. The resulting pattern was evaluated by the following methods.

[Sensitivity]

The cross-sectional shape of the resulting pattern was observed using a scanning electron microscope (S-4300, manufactured by Hitachi, Ltd.). The minimum irradiation energy for resolving a 0.15 μm line (line/space=1/1) was defined as sensitivity.

[Resolution]

The limiting resolution (separate resolution of the line and the space) at the exposure amount at which the foregoing sensitivity was exhibited was defined as resolving power.

[Pattern Shape]

The cross-sectional shape of a 0.15 μm-line pattern at the exposure amount at which the foregoing sensitivity was exhibited was observed using a scanning electron microscope (S-4300, manufactured by Hitachi, Ltd.) and evaluated on a scale of three grades of "rectangular", "slightly taper", and "taper".

[Line Edge Roughness]

With respect to arbitrary 30 points in a length of 50 μm in the longitudinal direction of a 0.15 μm-line pattern at the exposure amount at which the foregoing sensitivity was exhibited, line widths were measured, and fluctuation thereof was evaluated in terms of 3σ.

(iii) Evaluation Results:

The results of Example 1 were very good such that the sensitivity was 4.5° C./cm$^2$, the resolution was 0.10 μm, the pattern shape was rectangular, and the line edge roughness was 6.5 nm.

Examples 2 to 18

The resist preparation, coating and electron beam exposure evaluation were carried out in the same manner as in Example 1, except for using each of compounds shown in Table 1 below. The evaluation results are shown in Table 2 below.

Comparative Example 1

The resist preparation, coating and electron beam exposure evaluation were carried out in the same manner as in Example 1, except for changing the amounts of the sulfonic acid generator and the resin (A1-3) to 4 parts by weight and 95.6 parts by weight, respectively.

Comparative Example 2

The resist preparation, coating and electron beam exposure evaluation were carried out in the same manner as in Example 1, except for changing the amounts of the sulfonic acid generator and the nitrogen-containing basic compound to 4 parts by weight and 0.15 parts by weight, respectively.

Comparative Example 3

The resist preparation, coating and electron beam exposure evaluation were carried out in the same manner in Example 1, except for using the following resin (AA-1) in place of the resin (A).

Comparative Example 4

The resist preparation, coating and electron beam exposure evaluation were carried out in the same manner as in Example 1, except for changing the amounts of the sulfonic acid generator and the resin (A1-3) to 21 parts by weight and 78.6 parts by weight, respectively.

The resist compositions and evaluation results are shown in Table 1 and Table 2, respectively.

Resin (AA-1) (acetalization rate (molar ratio): 0.3)

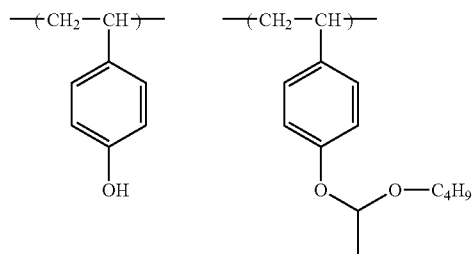

Other compounds used in the Examples and Comparative Examples are described below.

[Nitrogen-containing Basic Compound]
E-1: Tri-n-hexylamine
E-2: 2,4,6-Triphenylimidazole
E-3: Tetra-(n-butyl)ammonium hydroxide

[Surfactant]
W-1: Fluorine based surfactant, Megafac F-176 (manufactured by Dainippon Ink and Chemicals, Incorporated)
W-2: Fluorine/silicon based surfactant, Megafac R08 (manufactured by Dainippon Ink and Chemicals, Incorporated)
W-3: Silicon based surfactant, Polysiloxane Polymer KP341 (manufactured by Shin-Etsu Chemical Co., Ltd.)

TABLE 1

(The numerals in the parentheses stand for % by weight in the total solid content of the resist)

| Example No. | Resin (A1) | Resin (A2) | Component (B): Sulfonic acid generator | Nitrogen-containing basic compound | Other compounds |
|---|---|---|---|---|---|
| 1 | A1-3: Mw = 9,500, x/y = 76/24 Mw/Mn = 1.05 (91.6) | — | B-2 (8.0) | E-1 (0.3) | W-1 (0.1) |
| 2 | A1-2: Mw = 9,600, x/y = 75/25 Mw/Mn = 1.05 (90.5) | — | B-3 (7.5) B-33 (2.5) | E-2 (0.3) | W-1 (0.1) |
| 3 | A1-4: Mw = 10,500, x/y = 71/29 Mw/Mn = 1.05 (92.1) | — | B-12 (7.5) | E-1 (0.3) | W-1 (0.1) |
| 4 | A1-8: Mw = 15,000, x/y = 82/18 Mw/Mn = 1.03 (90.6) | — | B-14 (9.0) | E-2 (0.3) | W-1 (0.1) |
| 5 | A1-10: Mw = 8,500, x/y = 86/14 Mw/Mn = 1.05 (71.0) | A2-5: Mw = 15,500 x/y = 75/25 Mw/Mn = 1.07 (20.0) | B-15 (8.5) | E-1 (0.3) | W-1 (0.2) |
| 6 | A1-12: Mw = 10,000, x/y = 82/18 Mw/Mn = 1.05 (61.0) | A2-2: Mw = 9,200 x/y = 70/30 Mw/Mn = 1.05 (30.2) | B-16 (8.5) | E-2 (0.3) | — |
| 7 | A1-14: Mw = 12,000, x/y = 83/17 Mw/Mn = 1.10 (88.4) | — | B-17 (8.0) B-38 (3.0) | E-1 (0.4) | W-2 (0.2) |
| 8 | A1-15: Mw = 8,000, x/y = 78/22 Mw/Mn = 1.20 (81.5) | A2-7: Mw = 8,000 x/y = 65/35 Mw/Mn = 1.10 (10.0) | B-19 (8.0) | E-2 (0.3) | W-2 (0.1) D-1 (0.1) |
| 9 | A1-18: Mw = 9,500, x/y = 74/26 Mw/Mn = 1.05 (88.0) | — | B-21 (11.5) | E-1 (0.3) D-2 (0.1) | W-2 (0.1) |
| 10 | A1-19: Mw = 9,500, x/y = 75/25 Mw/Mn = 1.05 (88.0) | — | B-22 (11.4) | E-2 (0.3) D-7 (0.2) | W-1 (0.1) |
| 11 | A1-22: Mw = 9,500, x/y = 75/25 Mw/Mn = 1.05 (93.0) | — | B-23 (6.5) | E-1 (0.2) | W-1 (0.1) D-14 (0.2) |
| 12 | A1-23: Mw = 10,500, x/y = 82/18 Mw/Mn = 1.10 (61.5) | A2-8: Mw = 8,200 x/y = 74/26 Mw/Mn = 1.10 (30.0) | B-25 (6.0) J-8 (2.0) | E-2 (0.3) | W-1 (0.1) D-17 (0.1) |
| 13 | A1-26: Mw = 25,000, x/y = 78/22 Mw/Mn = 1.65 (74.6) | A2-11: Mw = 8,500 x/y/z = 70/22/8 Mw/Mn = 1.75 (15.0) | B-24 (7.5) J-1 (2.5) | E-1 (0.3) | W-3 (0.1) |
| 14 | A1-30: Mw = 8,500, x/y/z = 80/15/5 Mw/Mn = 1.38 (55.9) | A2-2: Mw = 9,200 x/y = 70/30 Mw/Mn = 1.05 (40.0) | B-31 (13.5) | E-2 (0.5) | W-3 (0.1) |
| 15 | A1-32: Mw = 8,000, x/y/z = 70/21/9 Mw/Mn = 1.50 (89.0) | — | B-33 (8.0) J-14 (2.5) | E-3 (0.3) | W-3 (0.1) |
| 16 | A1-34: Mw = 9,500, x/y/z = 77/15/8 Mw/Mn = 1.05 (90.6) | — | B-40 (7.5) J-17 (1.5) | E-3 (0.3) | W-1 (0.1) |
| 17 | A1-2: Mw = 8,000, x/y = 83/17 Mw/Mn = 1.05 (89.6) | — | B-41 (8.0) J-25 (2.0) | E-3 (0.3) | W-1 (0.1) |
| 18 | A1-13: Mw = 15,000, x/y = 83/17 Mw/Mn = 1.10 (91.1) | — | B-10 (8.5) | E-3 (0.3) | W-1 (0.1) |

TABLE 1-continued (The numerals in the parentheses stand for % by weight in the total solid content of the resist)

| Example No. | Resin (A1) | Resin (A2) | Component (B): Sulfonic acid generator | Nitrogen-containing basic compound | Other compounds |
|---|---|---|---|---|---|
| Comparative Example 1 | A1-3: Mw = 9,600, x/y = 76/24 Mw/Mn = 1.05 (95.6) | — | B-2 (4.0) | E-1 (0.3) | W-1 (0.1) |
| Comparative Example 2 | A1-3: Mw = 9,600, x/y = 76/24 Mw/Mn = 1.05 (95.75) | — | B-2 (4.0) | E-1 (0.15) | W-1 (0.1) |
| Comparative Example 3 | AA-1: Mw = 9,200, x/y = 70/30 Mw/Mn = 1.05 (91.6) | — | B-2 (8.0) | E-1 (0.3) | W-1 (0.1) |
| Comparative Example 4 | A1-3: Mw = 9,600, x/y = 76/24 Mw/Mn = 1.05 (78.6) | — | B-2 (21.0) | E-1 (0.3) | W-1 (0.1) |

TABLE 2

| Example No. | Sensitivity ($\mu C/cm^2$) | Resolution ($\mu m$) | Pattern shape 3-Grade evaluation | Line edge roughness (nm) |
|---|---|---|---|---|
| 1 | 4.5 | 0.10 | Rectangular | 6.5 |
| 2 | 4.5 | 0.11 | Rectangular | 5.4 |
| 3 | 5.5 | 0.09 | Rectangular | 6.2 |
| 4 | 5.0 | 0.10 | Rectangular | 6.3 |
| 5 | 5.0 | 0.10 | Rectangular | 4.2 |
| 6 | 4.5 | 0.10 | Rectangular | 4.4 |
| 7 | 4.0 | 0.11 | Rectangular | 5.8 |
| 8 | 5.5 | 0.09 | Rectangular | 4.3 |
| 9 | 6.5 | 0.10 | Rectangular | 6.6 |
| 10 | 6.0 | 0.09 | Rectangular | 5.6 |
| 11 | 6.5 | 0.09 | Rectangular | 6.3 |
| 12 | 5.5 | 0.09 | Rectangular | 4.0 |
| 13 | 4.5 | 0.10 | Rectangular | 4.7 |
| 14 | 4.0 | 0.09 | Rectangular | 4.7 |
| 15 | 5.5 | 0.09 | Rectangular | 5.3 |
| 16 | 4.5 | 0.09 | Rectangular | 5.5 |
| 17 | 4.5 | 0.10 | Rectangular | 5.5 |
| 18 | 5.0 | 0.10 | Rectangular | 6.1 |
| Comparative Example 1 | 10.5 | 0.09 | Rectangular | 10.5 |
| Comparative Example 2 | 5.0 | 0.15 | Taper | 14.0 |
| Comparative Example 3 | 8.5 | 0.15 | Slightly taper | 12.5 |
| Comparative Example 4 | 4.0 | 0.15 | Taper | 17.0 |

It can be noted from Table 2 that with respect to the pattern formation upon irradiation with electron beams, the positive working resist compositions of the invention have high sensitivity and high resolution and are excellent in pattern shape and line edge roughness as compared with the compositions of the Comparative Examples.

<Evaluation with EUV Exposure>

Examples 19 to 20 and Comparative Examples 5 to 7

Resist films were obtained in the same manner as in Example 1, using the respective resist compositions of the foregoing Examples 1 to 2 and Comparative Examples 1 to 3. However, the resist film thickness was set up at 0.15 μm. Each of the resulting resist films was subjected to open-frame-exposure with EUV rays (wavelength: 13 nm) while varying the exposure amount by every 0.5 mJ within the range of from 0 to 5.0 mJ and then baked at 110° C. for 90 seconds. Thereafter, a dissolution rate at each exposure amount was measured using a 2.38% by weight tetramethylammonium hydroxide (TMAH) aqueous solution to obtain a sensitivity curve. In the sensitivity curve, the exposure amount at the time when the dissolution rate of the resist was saturated was defined as sensitivity, and a dissolution contrast (γ value) was determined from a gradient of the linear section of the sensitivity curve. The larger the γ value, the more excellent the dissolution contrast is.

The results are shown in Table 3.

TABLE 3

| Example No. | Sensitivity($\mu C/cm^2$) | γ Value |
|---|---|---|
| Example 19 | 2.0 | 9.5 |
| Example 20 | 2.0 | 10.5 |
| Comparative Example 5 | >5.0 | 9.0 |
| Comparative Example 6 | 2.5 | 4.5 |
| Comparative Example 7 | 4.5 | 5.5 |

It can be noted from Table 3 that in the characteristic evaluation upon exposure with EUV rays, the positive working resist compositions of the invention are excellent in view of high sensitivity and high contrast as compared with the compositions of the Comparative Examples.

According to the invention, a positive working resist composition that is excellent in sensitivity and resolution and further excellent in pattern shape and line edge roughness with respect to the pattern formation upon exposure with electron beams, X rays or EUV rays can be provided.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive working resist composition comprising (A1) a resin containing a repeating unit represented by formula (1) shown below and a repeating unit represented by formula (2) shown below and having a property of being insoluble or sparingly soluble in an alkali developing solution and becoming soluble in an alkali developing solution by the action of an acid, (B) a compound capable of generating sulfonic acid upon irradiation with active rays or radiations in an amount of from 5 to 20% by weight based on the total solid content of the positive working resist composition, and (D) a compound capable of generating a carboxylic acid upon irradiation with active rays or radiations in an amount of from 0.05 to 3% by weight based on the total solid content of the positive working resist composition:

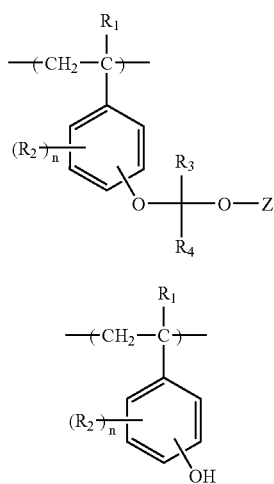

(1)

(2)

wherein $R_1$ represents a hydrogen atom, a methyl group, a cyano group, a halogen atom or a perfluoroalkyl group having from 1 to 4 carbon atoms; $R_2$ represents a hydrogen atom, an alkyl group, a halogen atom, an aryl group, an alkoxy group or an acyl group; $R_3$ and $R_4$ each independently represent a hydrogen atom or an alkyl group having from 1 to 4 carbon atoms; Z represents a hydrocarbon group having from 6 to 30 carbon atoms and containing at least one cyclic structural unit selected from an alicyclic structure, an aromatic cyclic structure and a bridged alicyclic structure; and n represents an integer of from 0 to 4.

2. The positive working resist composition according to claim 1, which further comprises (C) a nitrogen-containing basic compound.

3. The positive working resist composition according to claim 1, which further comprises (A2) a resin containing a repeating unit represented by formula (2) below and a repeating unit represented by formula (3) below and having a property of being insoluble or sparingly soluble in an alkali developing solution and becoming soluble in an alkali developing solution by the action of an acid:

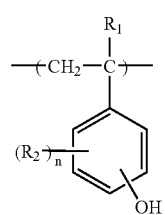

(2)

-continued

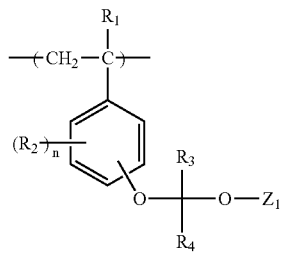

(3)

wherein $R_1$ represents a hydrogen atom, a methyl group, a cyano group, a halogen atom or a perfluoroalkyl group having from 1 to 4 carbon atoms; $R_2$ represents a hydrogen atom, an alkyl group, a halogen atom, an aryl group, an alkoxy group or an acyl group; $R_3$ and $R_4$ each independently represent a hydrogen atom or an alkyl group having from 1 to 4 carbon atoms; $Z_1$ represents a hydrocarbon group having from 1 to 5 carbon atoms; and n represents an integer of from 0 to 4.

4. The positive working resist composition according to claim 1, wherein an amount of the compound (B) capable of generating sulfonic acid upon irradiation with active rays or radiations is from 7 to 16% by weight based on the total solid content of the positive working resist composition.

5. The positive working resist composition according to claim 1, wherein the resin (A1) contains the repeating unit represented by formula (1), the repeating unit represented by formula (2) and a repeating unit represented by the following formula (4):

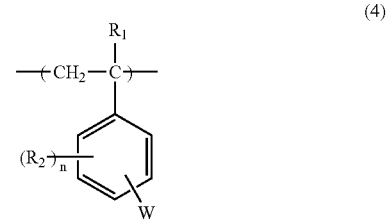

(4)

wherein, $R_1$, $R_2$, and n have the same meanings as $R_1$, $R_2$, and n in formula (1), respectively; and W represents a group that is not decomposed by the action of an acid.

6. The positive working resist composition according to claim 3, wherein the resin (A2) contains the repeating unit represented by the formula (2), the repeating unit represented by the formula (3) and a repeating unit represented by the formula (4):

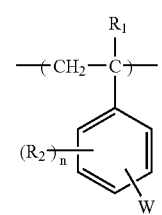

(4)

wherein, $R_1$, $R_2$, and n have the same meanings as $R_1$, $R_2$, and n in formula (2), respectively; and W represents a group that is not decomposed by the action of an acid.

7. The positive working resist composition according to claim 1, which further comprises a fluorine based and/or silicon based surfactant.

8. The positive working resist composition according to claim 1, wherein the weight ratio of the compound (D) capable of generating a carboxylic acid upon irradiation with active rays or radiations/the compound (B) capable of generating a sulfonic acid is 0.1/99.9 to 50/50.

9. The positive working resist composition according to claim 1, wherein the weight ratio of the compound (D)/the compound (B) is 1/99 to 40/60.

10. The positive working resist composition according to claim 1, wherein the weight ratio of the compound (D)/the compound (B) is 2/98 to 30/70.

* * * * *